(12) United States Patent
Chowdhury et al.

(10) Patent No.: US 9,397,111 B1
(45) Date of Patent: Jul. 19, 2016

(54) SELECT GATE TRANSISTOR WITH SINGLE CRYSTAL SILICON FOR THREE-DIMENSIONAL MEMORY

(71) Applicant: SanDisk Technologies Inc., Plano, TX (US)

(72) Inventors: Murshed Chowdhury, Fremont, CA (US); Yanli Zhang, San Jose, CA (US); Jin Liu, Fremont, CA (US); Raghuveer S Makala, Campbell, CA (US); Johann Alsmeier, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/927,828

(22) Filed: Oct. 30, 2015

(51) Int. Cl.
*H01L 27/115* (2006.01)
*H01L 21/02* (2006.01)

(52) U.S. Cl.
CPC ...... *H01L 27/1157* (2013.01); *H01L 21/02675* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 8,243,509 B2 | 8/2012 | Herner et al. | |
| 8,309,405 B2 | 11/2012 | Yang et al. | |
| 8,394,716 B2 | 3/2013 | Hwang et al. | |
| 8,405,142 B2 | 3/2013 | Katsumata et al. | |
| 8,415,742 B2 | 4/2013 | Kim et al. | |
| 8,569,827 B2* | 10/2013 | Lee | H01L 27/11582 257/315 |
| 9,035,372 B2 | 5/2015 | Song | |
| 2010/0214838 A1 | 8/2010 | Hishida et al. | |
| 2011/0233648 A1* | 9/2011 | Seol | H01L 21/32137 257/324 |

(Continued)

OTHER PUBLICATIONS

Lisoni, J.G., et al., "Laser Thermal Anneal of polysilicon channel to boost 3D memory performance," Symposium on VLSI Technology Digest of Technical Papers, Jun. 2014, 2 pages.

(Continued)

*Primary Examiner* — Evren Seven
(74) *Attorney, Agent, or Firm* — Vierra Magen Marcus LLP

(57) ABSTRACT

A fabrication process for a 3D memory structure provides a single crystal silicon channel for a drain-side select gate (SGD) transistor using a laser thermal anneal (LTA). The 3D memory structure includes a stack formed from an array of alternating conductive and dielectric layers. A NAND string is formed by filling a memory hole with memory films, including a charge trapping material, a tunnel oxide and a polysilicon channel. In one case, a separate oxide and polysilicon forms the SGD transistor gate oxide and channel respectively, where LTA is performed on the polysilicon. In another case, the same oxide and polysilicon are used for the SGD transistor and the memory cells. A portion of the polysilicon is converted to single crystal silicon. A back side of the single crystal silicon is subject to epitaxial growth and thermal oxidation via a void in a control gate layer.

20 Claims, 36 Drawing Sheets

(56) References Cited

U.S. PATENT DOCUMENTS

| | | | |
|---|---|---|---|
| 2012/0086072 A1* | 4/2012 | Yun | H01L 27/11578 257/329 |
| 2013/0270568 A1* | 10/2013 | Rabkin | H01L 29/6675 257/66 |
| 2014/0080297 A1 | 3/2014 | Mizushima et al. | |
| 2014/0131784 A1* | 5/2014 | Davis | H01L 27/11556 257/316 |
| 2014/0252363 A1* | 9/2014 | Liu | H01L 27/11556 257/66 |
| 2015/0076580 A1* | 3/2015 | Pachamuthu | H01L 27/11551 257/314 |
| 2015/0079743 A1* | 3/2015 | Pachamuthu | H01L 27/11551 438/268 |
| 2015/0079765 A1* | 3/2015 | Pachamuthu | H01L 21/28282 438/478 |
| 2015/0263024 A1* | 9/2015 | Hishida | H01L 21/823437 257/329 |
| 2015/0294978 A1* | 10/2015 | Lu | H01L 27/1157 438/269 |
| 2015/0318300 A1* | 11/2015 | Ohsaki | H01L 27/11582 438/258 |
| 2015/0333143 A1* | 11/2015 | Meldrim | H01L 29/4975 257/314 |
| 2015/0364488 A1* | 12/2015 | Pachamuthu | H01L 29/665 257/314 |
| 2016/0035742 A1* | 2/2016 | Kanakamedala | H01L 27/11582 438/264 |
| 2016/0043093 A1* | 2/2016 | Lee | H01L 27/11521 257/314 |

OTHER PUBLICATIONS

"Laser thermal anneal to boost performance of 3D memory devices," IMEC news, [http://www2.imec.be.be_en/press/imec-news/imecexicocolta.html], Oct. 16, 2013, 2 pages.

U.S. Appl. No. 14/690,863, filed Apr. 20, 2015.

\* cited by examiner

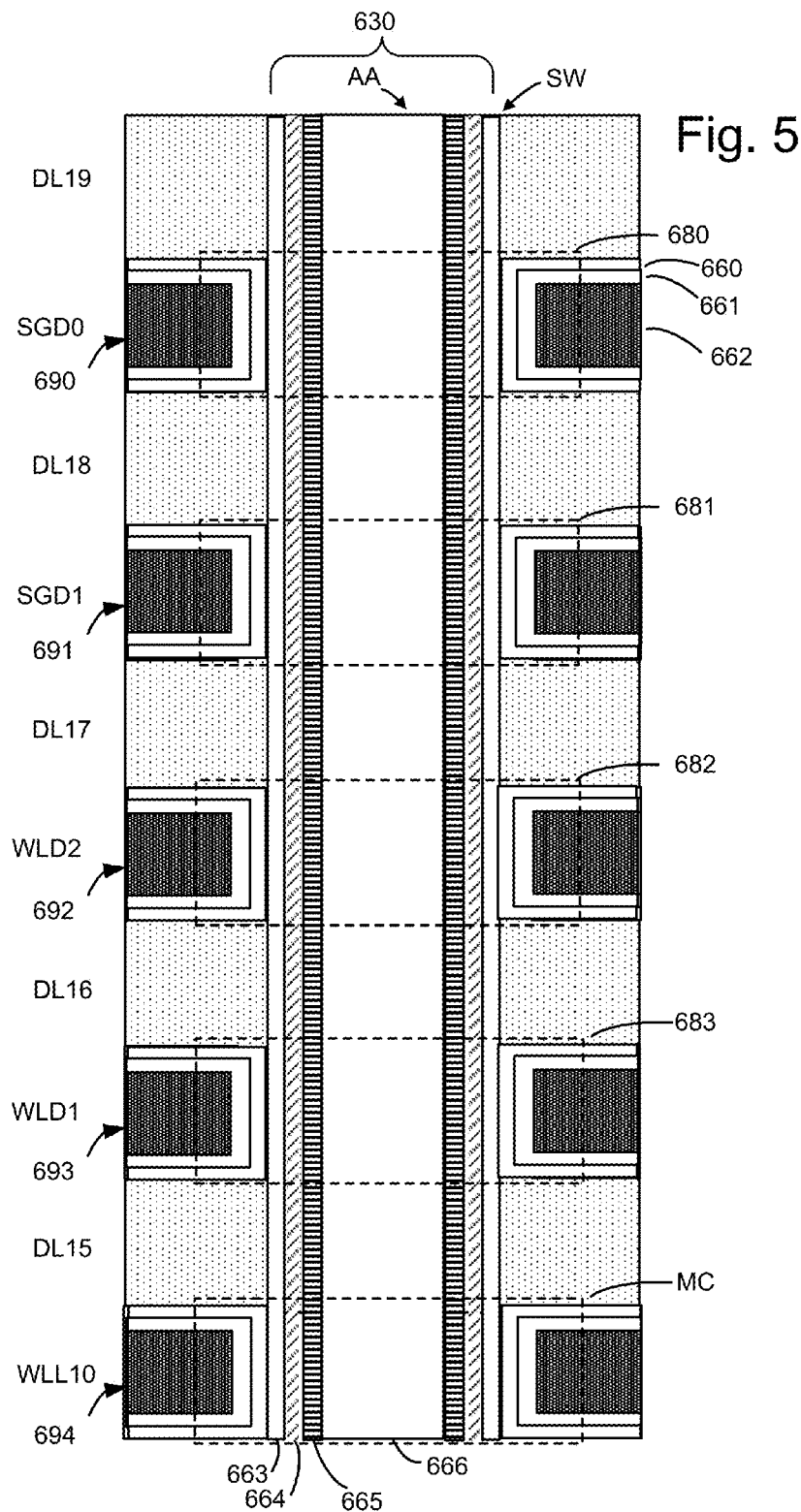

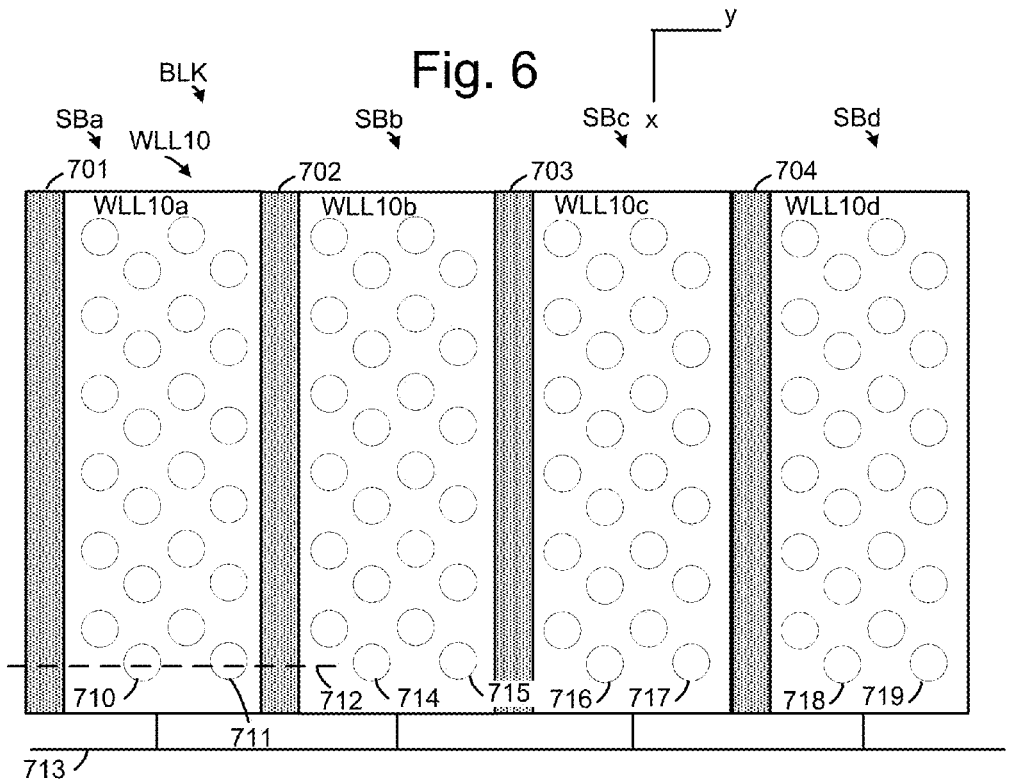
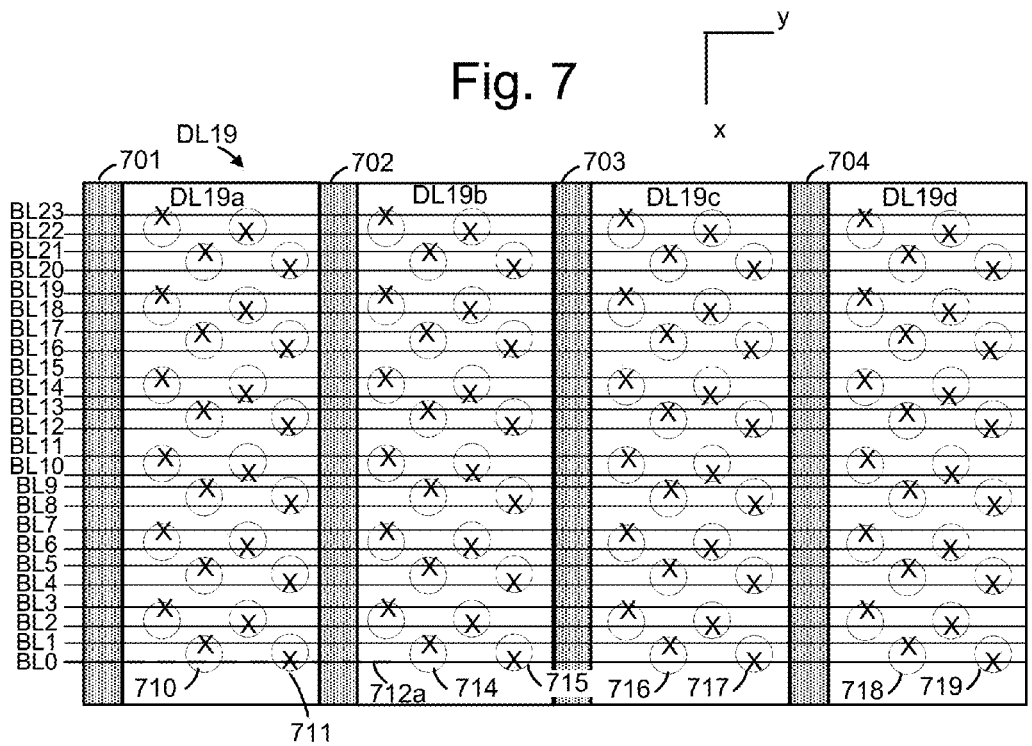

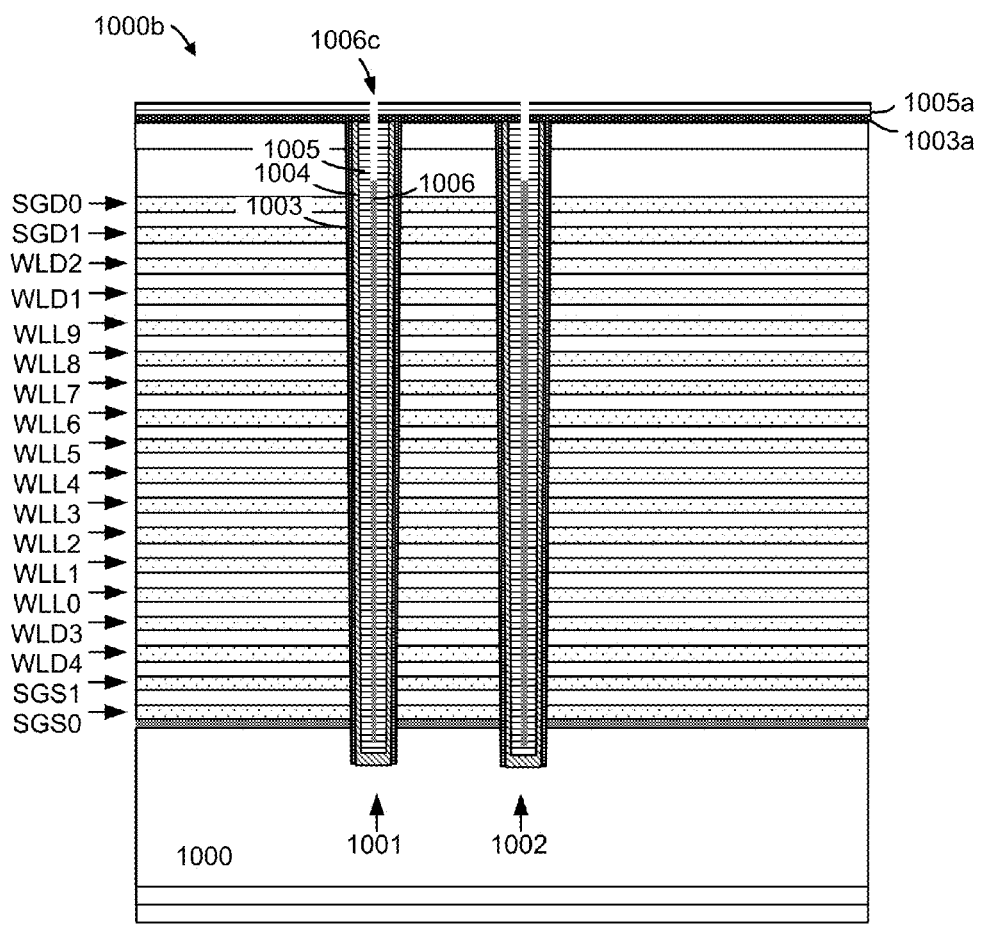

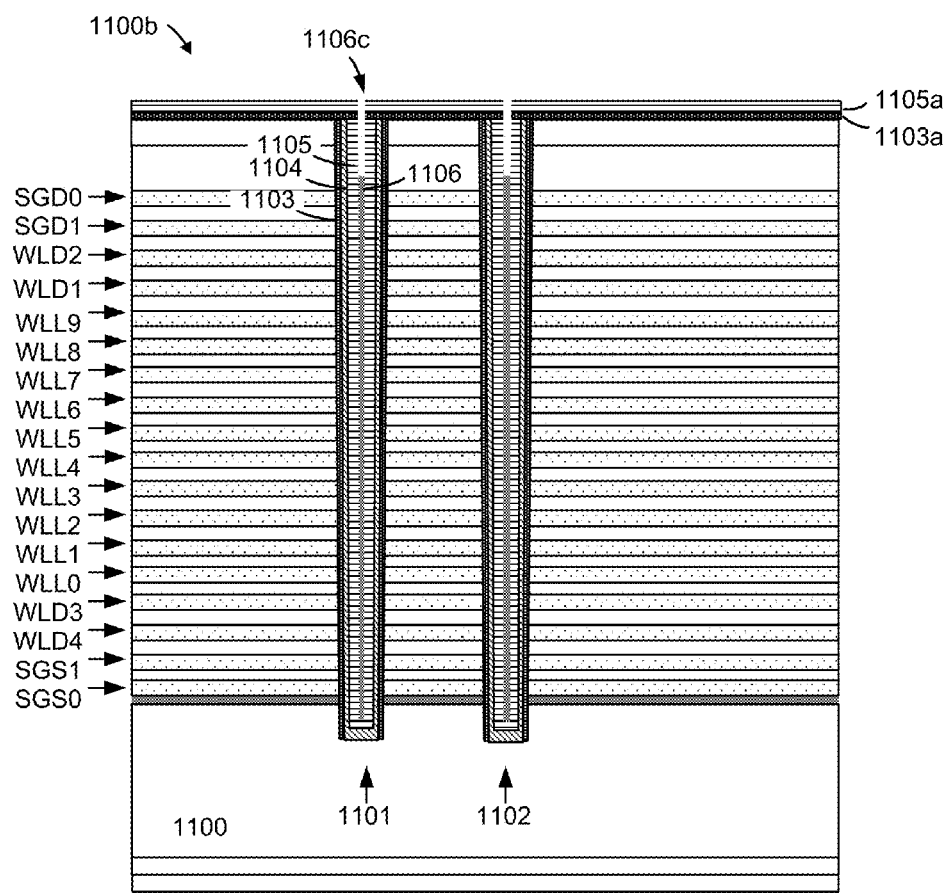

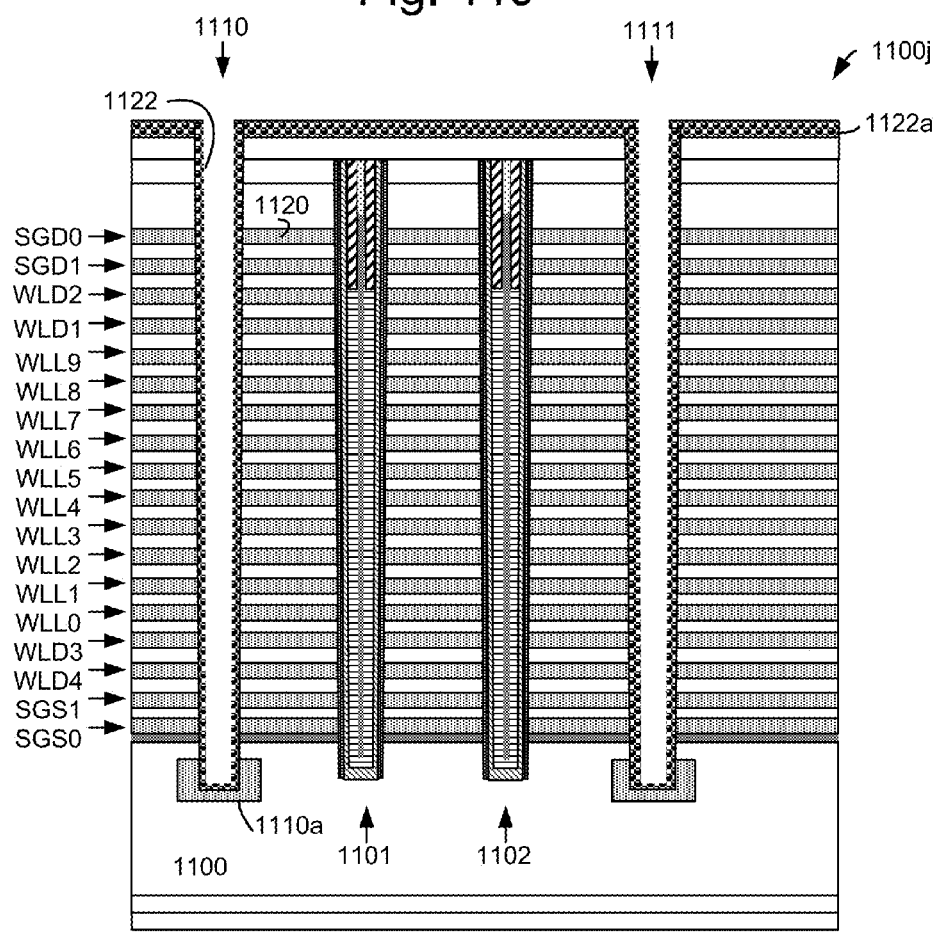

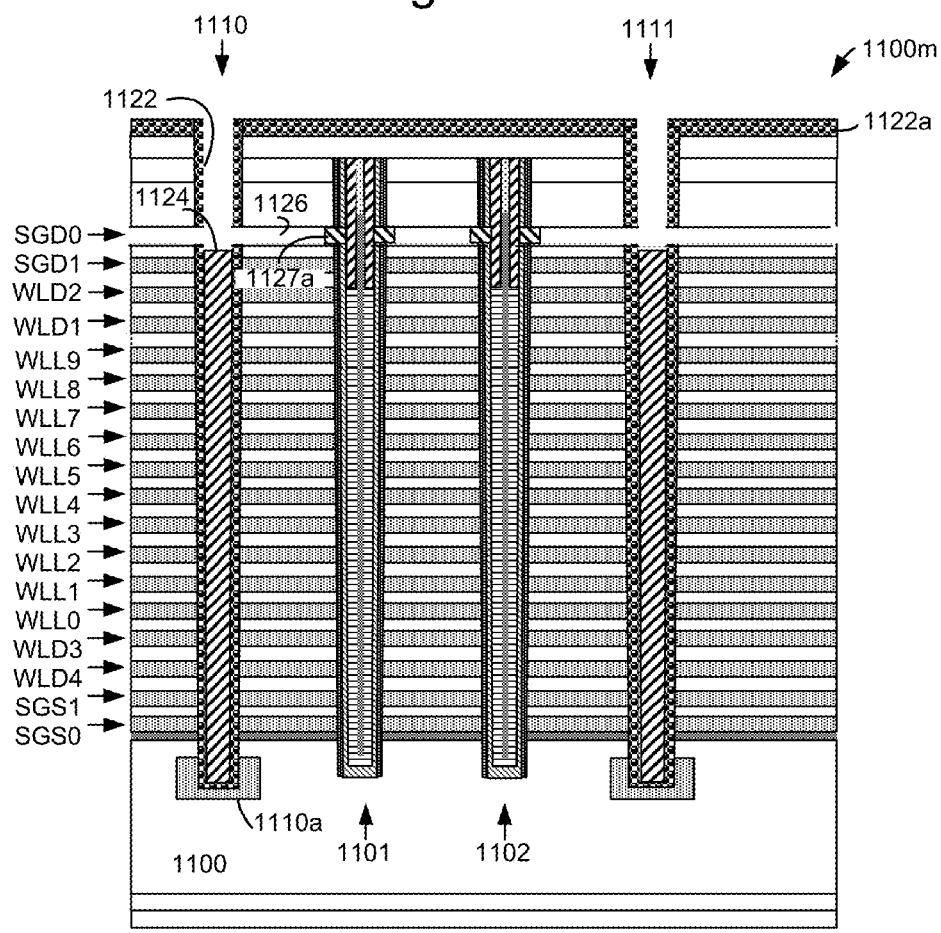

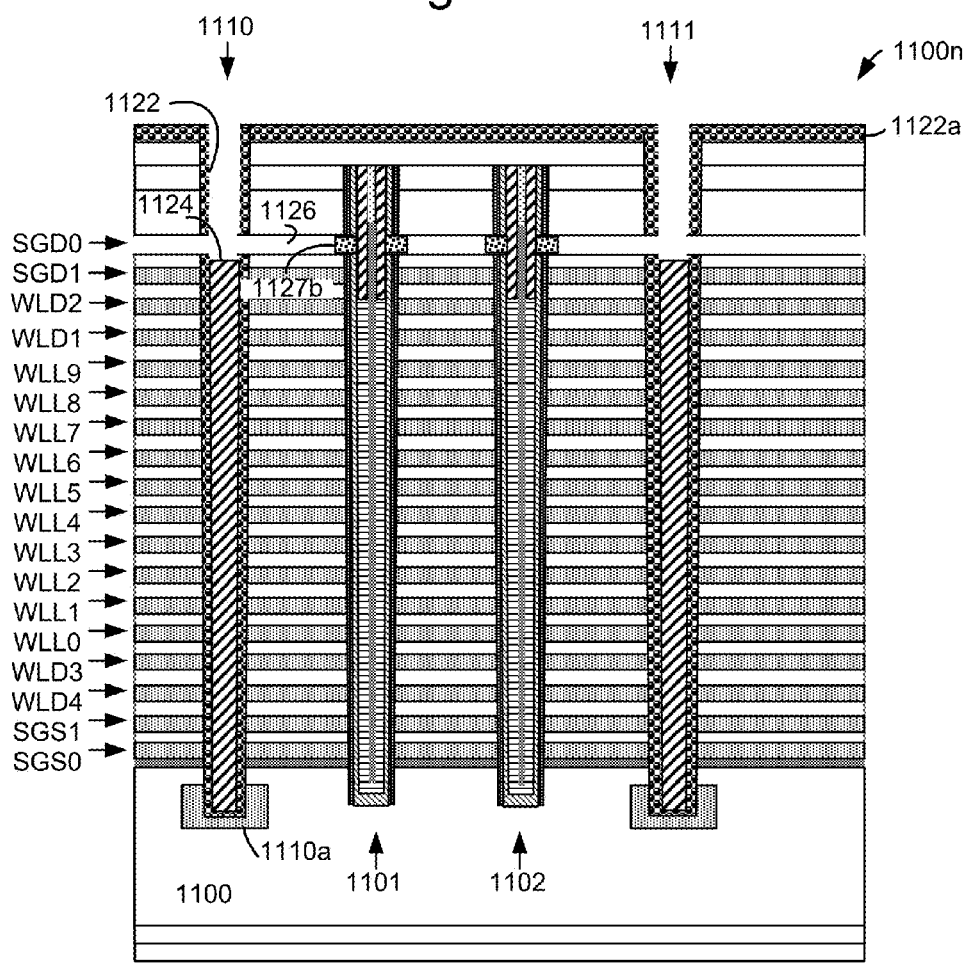

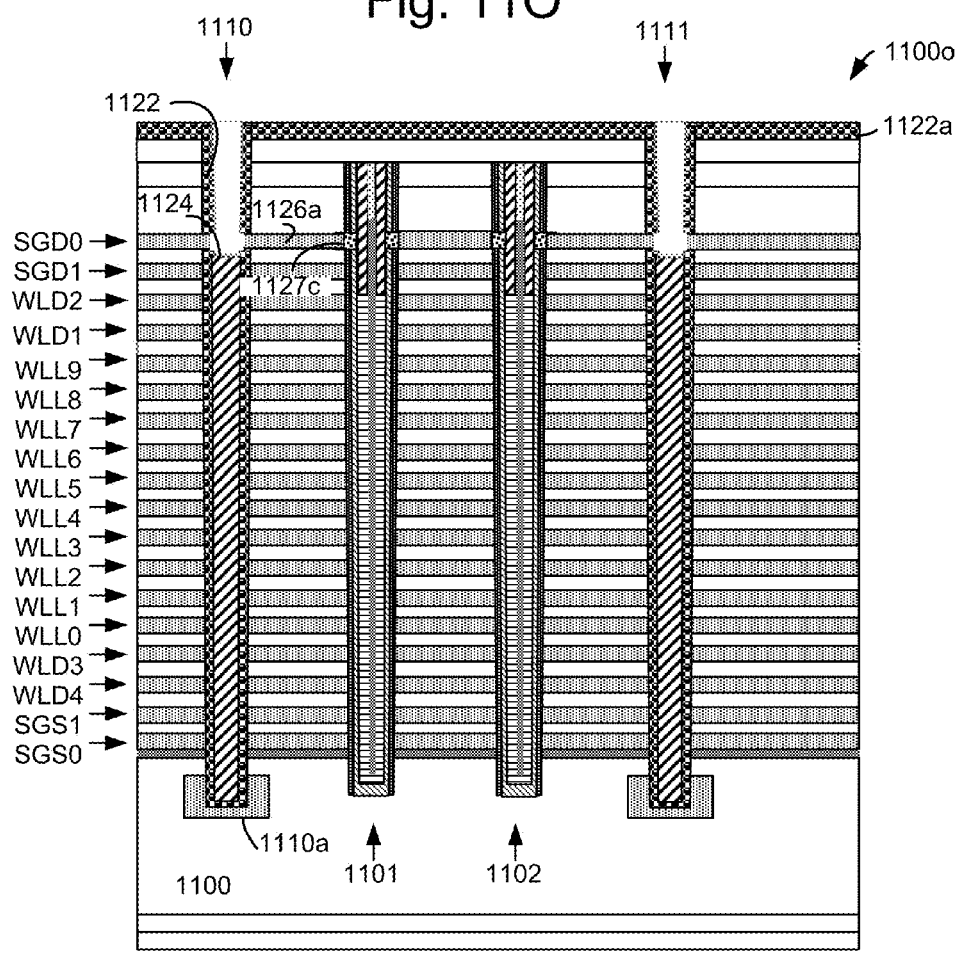

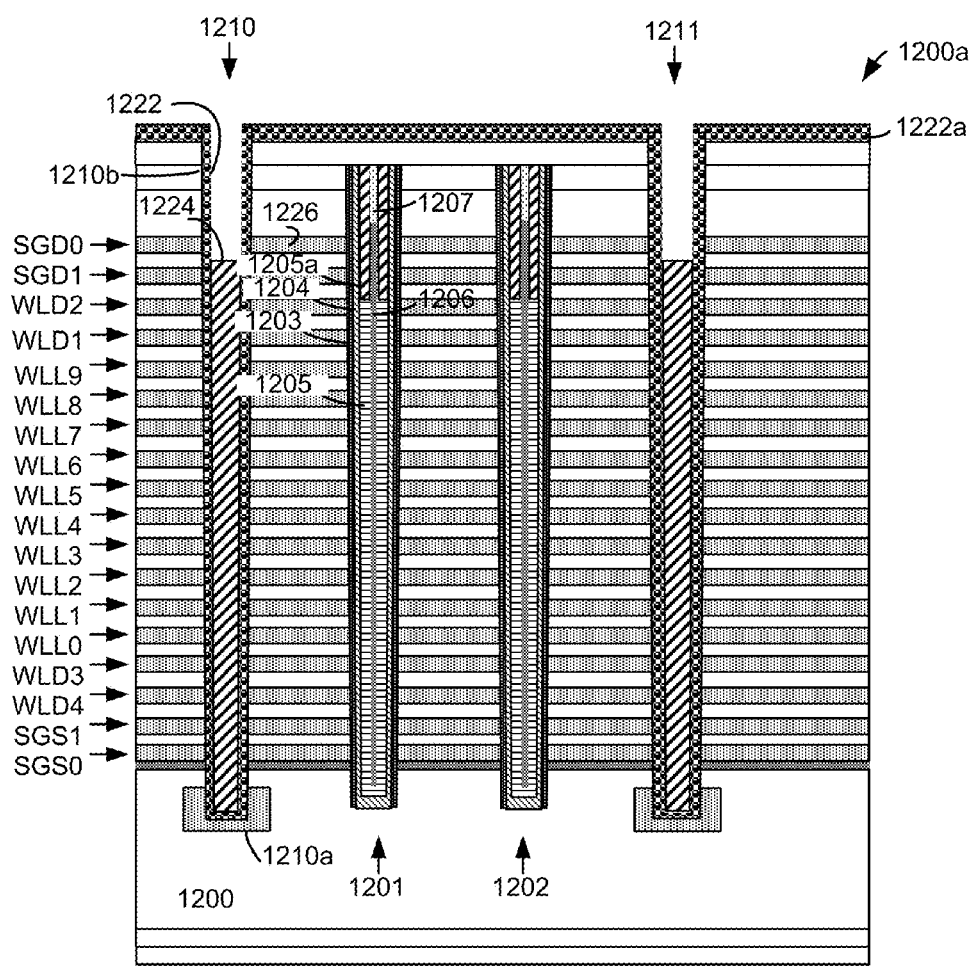

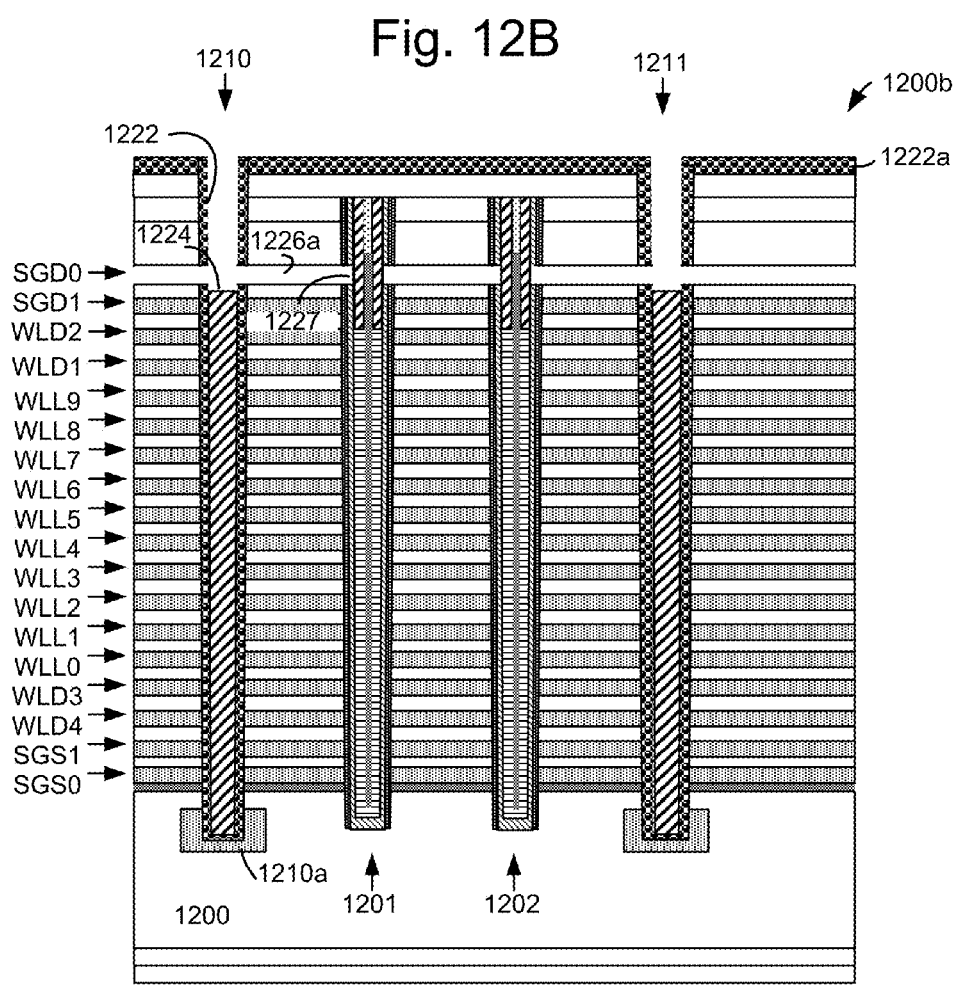

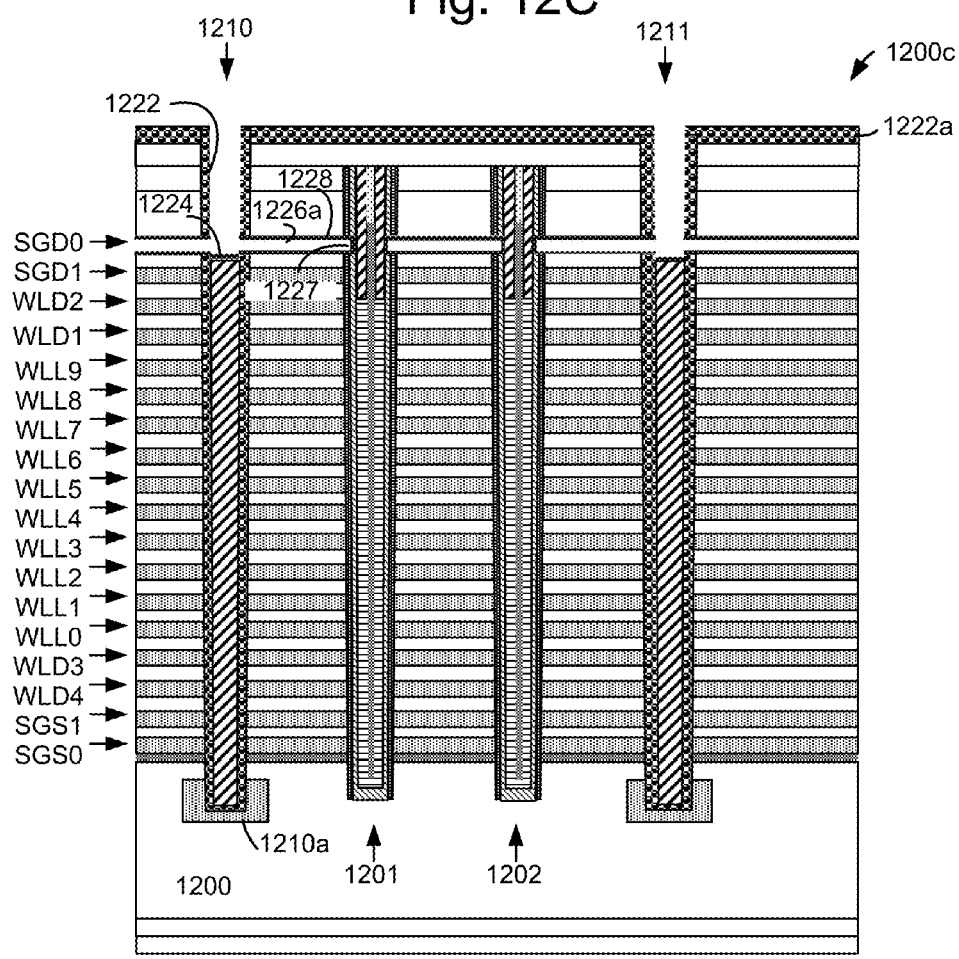

SELECT GATE TRANSISTOR WITH SINGLE CRYSTAL SILICON FOR THREE-DIMENSIONAL MEMORY

BACKGROUND

The present technology relates to memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, select gate transistors are provided at the ends of the string to selectively connect a channel of the string to a source line or bit line. However, various challenges are presented in providing such memory devices.

BRIEF DESCRIPTION OF THE DRAWINGS

FIG. 5 depicts a close-up view of the region 622 of the stack of FIG. 3.

FIG. 6 depicts a top view of an example word line layer WLL10 of the stack of FIG. 3.

FIG. 7 depicts a top view of an example top dielectric layer DL19 of the stack of FIG. 3.

FIG. 10A-10J describe the first approach of FIG. 9A.

FIG. 10A depicts a stack 1000a in an initial configuration.

FIG. 10B depicts a stack 1000b formed by recessing the core oxide of the stack 1000a of FIG. 10A.

FIG. 10C depicts a stack 1000c formed by etching back the memory films and core oxide of the stack 1000b of FIG. 10B to create an opening at the top of the memory hole.

FIG. 10D depicts a stack 1000d formed by depositing a gate oxide in the opening of the stack 1000c of FIG. 10C.

FIG. 10E depicts a stack 1000e formed by providing a closed cylinder of polysilicon in the opening of the stack 1000d of FIG. 10D and performing a laser thermal anneal (LTA) of the polysilicon.

FIG. 10F depicts a plot of crystallization depth versus LTA dose.

FIG. 10G depicts a plot of maximum crystallization depth versus channel length.

FIG. 10H depicts a stack 1000h formed by providing an open cylinder of polysilicon with a core oxide in the opening of the stack 1000d of FIG. 10D and performing a laser thermal anneal of the polysilicon, as an alternative to FIG. 10E.

FIG. 10I depicts a stack 1000i formed by providing a polysilicon contact in the opening of the stack 1000e of FIG. 10E.

FIG. 10J depicts a close-up view of the select gate transistors of FIG. 10A.

FIG. 11A depicts a stack 1100a in an initial configuration (same as the stack 1000a of FIG. 10A).

FIG. 11B depicts a stack 1100b formed by recessing the core oxide of the stack 1100a of FIG. 11A (same as the stack 1000b of FIG. 10B).

FIG. 11J depicts a stack 1100j formed by removing metal from the slits and depositing an oxide liner in the stack 1100i of FIG. 11I.

FIG. 11M depicts a stack 1100m formed by epitaxially growing silicon from a back side of the crystalline silicon in the memory hole, in the stack 1100l of FIG. 11L.

FIG. 11N depicts a stack 1100n formed by thermally oxidizing the epitaxially grown silicon in the stack 1100m of FIG. 11M.

FIG. 11O depicts a stack 1100o formed by depositing a metal in the void of the SGD control gate layer, in the stack 1100m of FIG. 11M.

FIG. 11Q depicts a close-up view of the select gate transistors of FIG. 11P.

FIG. 12A-12D describe the third approach of FIG. 9A.

FIG. 12A depicts a stack 1200a in an initial configuration (same as the stack 1100k of FIG. 11K).

FIG. 12B depicts a stack 1200b formed by providing a void in the SGD control gate layer in the stack 1200a of FIG. 12A (same as the stack 1100l in FIG. 11L).

FIG. 12C depicts a stack 1200c formed by depositing an oxide in the void in the SGD control gate layer in the stack 1200b of FIG. 12B.

FIG. 12D depicts a stack 1200d formed by filling a remainder of the slit with a conductive material in the stack 1200c of FIG. 12C.

DETAILED DESCRIPTION

Figure 1:
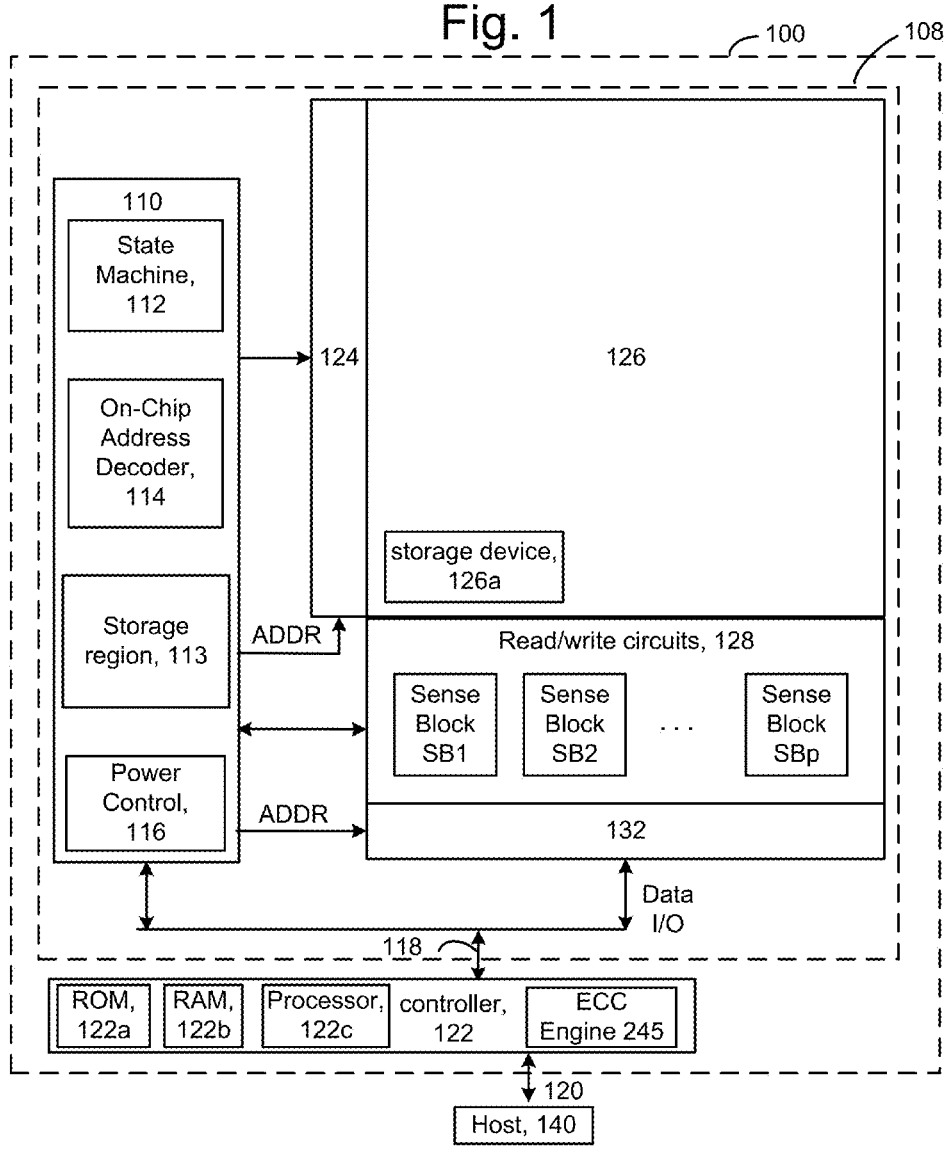
FIG. 1 is a block diagram of an example memory device.

Techniques are provided for fabricating a memory device in which a select gate transistor has a single crystal silicon channel.

A 3D memory structure may comprise a stack formed from an array of alternating conductive and dielectric layers. A memory hole is etched in the layers to define many memory layers simultaneously. A NAND string is then formed by filling the memory hole with appropriate materials. For example, a MONOS film stack can be used. This include a metal which forms the control gate layer in the stack, as well as a film stack of oxide-nitride-oxide followed by polysilicon (polycrystalline silicon) which are deposited along the sidewall of each memory hole. A 3D memory structure can have various configurations. For example, a straight NAND string extends in one memory hole, while a pipe- or U-shaped NAND string (P-BiCS) includes a pair of vertical columns of memory cells which extend in two memory holes and which are joined by a bottom back gate.

In some memory devices, the memory cells are joined to one another such in NAND strings in a block or sub-block. Each NAND string comprises a number of memory cells connected in series between one or more drain-side select gate transistors (SGD transistors), on a drain-side of the NAND string which is connected to a bit line, and one or more source-side select gate transistors (SGS transistors), on a source-side of the NAND string which is connected to a source line. Further, the memory cells can be arranged with a common word line) which acts a control gate. The control gates of the memory cells can be provided by the conductive layers in the stack. However, various challenges are presented in fabricating such memory devices.

For example, typically the same oxide layer is used for the memory cells and the SGD transistor, so that the SGD transistor cannot be independently optimized. Also, the same polysilicon channel may be used for the memory cells and the SGD transistor. This can result in variations in threshold voltage (Vth) for the SGD transistor.

In one approach, to address these and other issues, a memory device is provided in which the gate oxide of the SGD transistor is independent of the MONOS layers used for the memory cells. In another aspect, a single crystalline silicon is provided as the channel of the SGD transistor. In one approach, a laser thermal anneal (LTA) process is performed on polysilicon to cause the silicon grain size to increase toward crystalline silicon.

One example implementation provides a separate oxide and polysilicon adjacent to the SGD transistor (separate from the oxide and polysilicon used for the memory cells). The LTA is then performed on this separate polysilicon.

In another example implementation, the same oxide layer and polysilicon layer are used for the SGD transistor and the memory cells. A portion of the polysilicon which is adjacent to the SGD transistor is subject to LTA, resulting in single crystal silicon, e.g., mono-crystalline silicon. Subsequently, a back side of the single crystal silicon is accessed from a void in the control gate layer. A portion of the oxide is removed to expose the single crystal silicon. An epitaxial process is performed to grow the single crystal silicon laterally. The epitaxial grown silicon is then subject to a thermal oxidation process. Metal is then provided in the void to form the control gate.

In another example implementation, the above approach is followed, but an oxide is deposited in the void instead of providing the oxidized, epitaxially grown silicon. Combinations of the above approaches could be used as well. For example, an oxide can be deposited in the void after forming the oxidized, epitaxially grown silicon.

Advantages include the ability to independently tune the Vth of the SGD transistor and thus the SGD gate voltage, a narrower Vth distribution and avoiding the need to program the SGD transistor. The ability to control the on-off characteristics of the SGD transistor is also improved (see FIG. 9C).

Moreover, it is possible to have multiple SGD transistors in a NAND string, where one or more SGD transistors have a crystalline silicon channel while the one or more other SGD transistors have a polysilicon channel. Or, all of the SGD transistors may have a crystalline silicon channel.

Various other features and benefits are described below. FIG. 1-8 describes a general configuration of a 3D memory device. FIG. 9A-12D describe the fabrication of a 3D memory device which includes the above-mentioned implementations.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for programming parameters.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform various operations such as read, write and erase. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
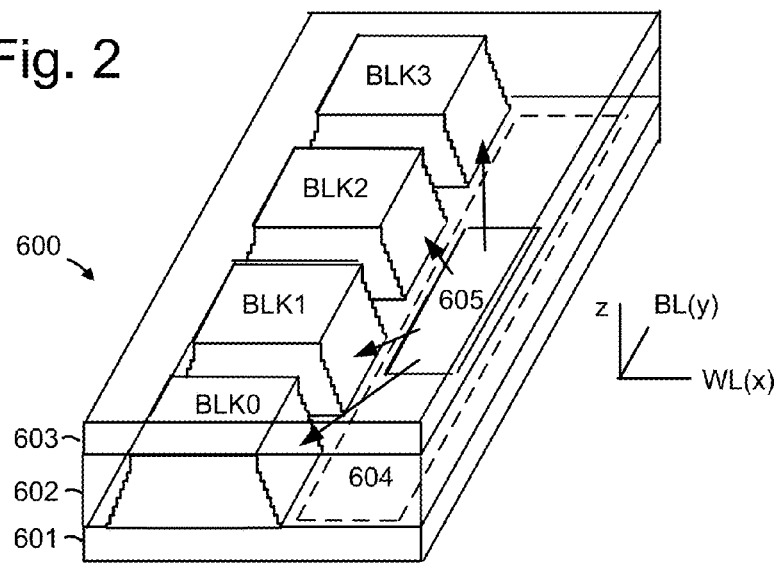
FIG. 2 is a perspective view of a memory device 600 comprising a set of blocks in an example three-dimensional configuration of the memory array 126 of FIG. 1.

FIG. 2 is a perspective view of a memory device 600 comprising a set of blocks in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 3:
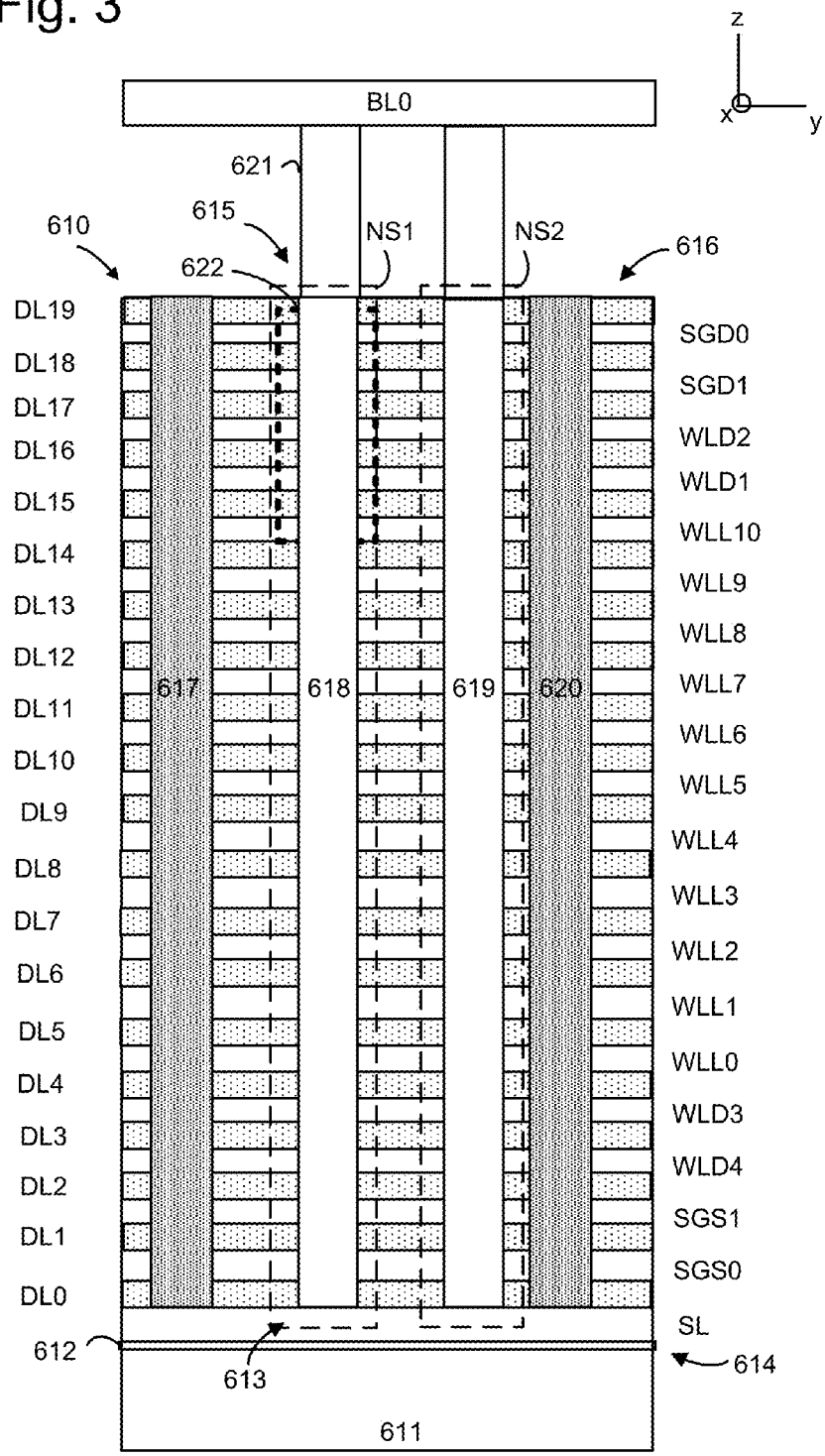
FIG. 3 depicts an example cross-sectional view of a portion of one of the blocks of FIG. 2.

FIG. 3 depicts an example cross-sectional view of a portion of one of the blocks of FIG. 2. The block comprises a stack 610 of alternating conductive and dielectric layers. In this example, the conductive layers comprise two SGD layers, two SGS layers and four dummy word line layers WLD1, WLD2, WLD3 and WLD4, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 5.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal or doped polysilicon. The slits may also be used to access the control gate layers to replace a scarified material with metal and to access the back side of materials in the memory holes, in some cases. A portion of a bit line BL0 is also depicted. A conductive via 621 connects the drain-end 615 to BL0.

Figure 4:
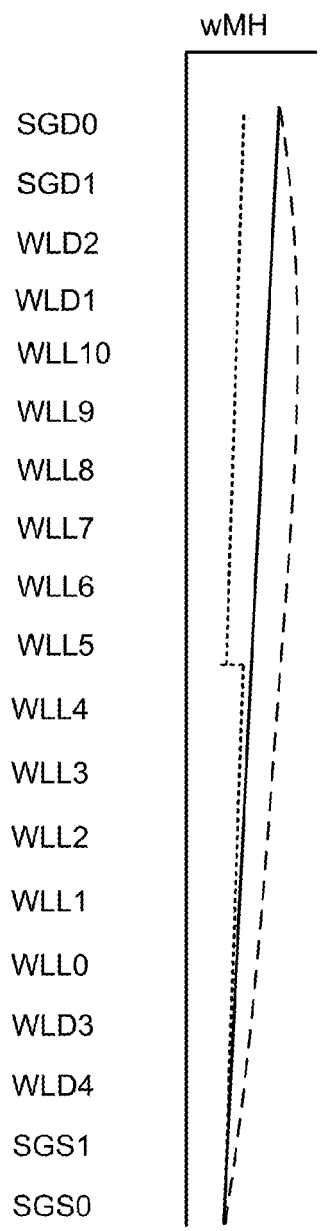
FIG. 4 depicts a plot of memory hole diameter in the stack of FIG. 3.

FIG. 4 depicts a plot of memory hole diameter in the stack of FIG. 3. The vertical axis is aligned with the stack of FIG. 3 and depicts a width (wMH), e.g., diameter, of the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole (solid line). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

A block may comprise a three-dimensional structure in which the memory cells are arranged along vertical memory holes, the vertical memory holes have varying diameters; and each subset is associated with portions of the vertical memory holes having similar diameters.

FIG. 5 depicts a close-up view of the region 622 of the stack of FIG. 3. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 6 depicts a top view of an example word line layer WLL10 of the stack of FIG. 3. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions WLL10a, WLL10b, WLL10c and WLL10d which are each connected by a connector 713. The last region of a word line layer in a block can be connected to a first region of a word line layer in a next block, in one approach. The connector, in turn, is connected to a voltage driver for the word line layer. The region WLL10a has example memory holes 710 and 711 along a line 712. See also FIGS. 7 and 8. The region WLL10b has example memory holes 714 and 715. The region WLL10c has example memory holes 716 and 717. The region WLL10d has example memory holes 718 and 719. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Each circle can alternatively represent a memory cell which is provided by the materials in the memory hole and by the adjacent word line layer.

Metal-filled slits 701, 702, 703 and 704 (e.g., metal interconnects) may be located between and adjacent to the edges of the regions WLL10a-WLL10d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8 for further details of the sub-blocks SBa-SBd of FIG. 6.

FIG. 7 depicts a top view of an example top dielectric layer DL19 of the stack of FIG. 3. The dielectric layer is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 6 are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8:
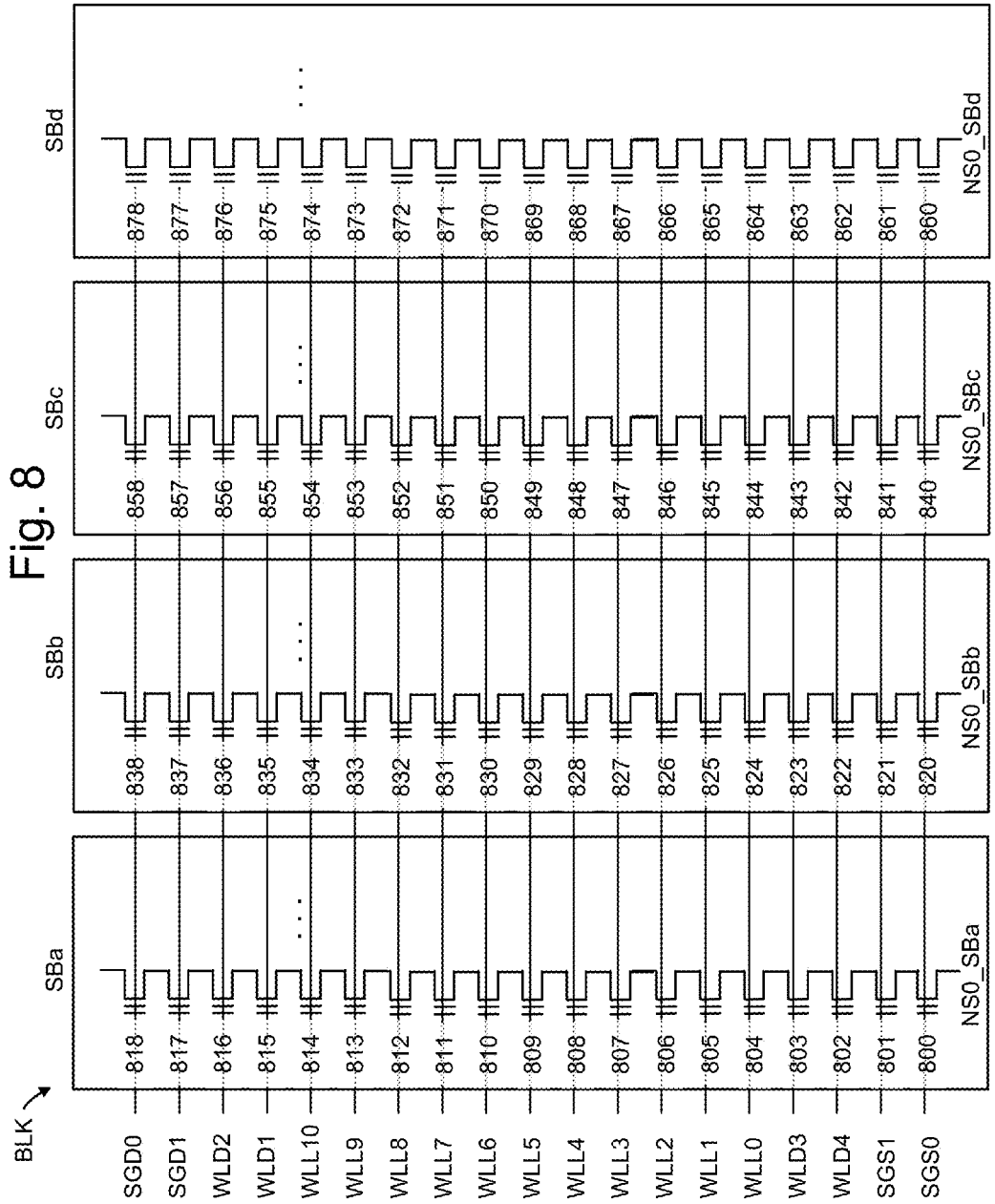
FIG. 8 depicts example NAND strings in the sub-blocks SBa-SBd of FIG. 6.

FIG. 8 depicts example NAND strings in the sub-blocks SBa-SBd of FIG. 6. The sub-blocks are consistent with the structure of FIG. 3. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

Memory cells on WL8 include memory cells 812, 832, 852 and 872. Memory cells on WL9 include memory cells 813, 833, 853 and 873. In this example, the programming of the block may occur sub-block by sub-block. For example, SBa may be programmed from WLL0-WLL10, then SBb may be programmed from WLL0-WLL10, then SBc may be programmed from WLL0-WLL10 and then SBd may be programmed from WLL0-WLL10.

Figure 9A:
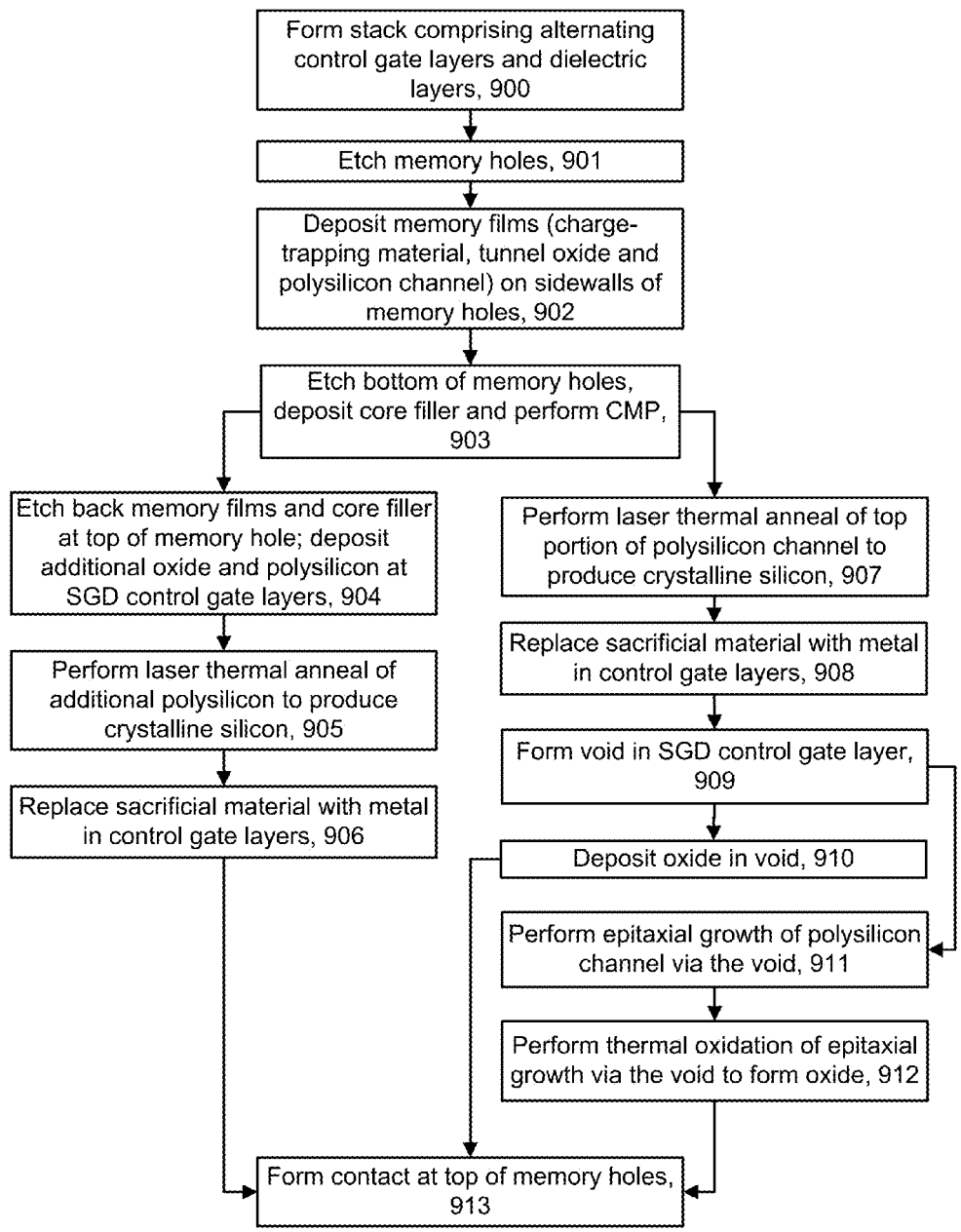
FIG. 9A depicts an example fabrication process in which a single crystal silicon is provided as the channel of a select gate transistor.

FIG. 9A depicts an example fabrication process in which a single crystal silicon is provided as the channel of a select gate transistor. The steps include forming a stack comprising alternating control gate layers and dielectric layers (step 900), etching memory holes (step 901), depositing memory films (e.g., charge-trapping material, tunnel oxide and polysilicon channel) on sidewalls of the memory holes (step 902), and etching the bottom of memory holes, depositing a core filler and perform chemical-mechanical polishing (CMP) to remove the excess memory film and core filler on top of the stack (step 903).

Subsequently, in a first approach, step 904 includes etching back the memory films and core filler at the top of the memory hole, and depositing an additional oxide and polysilicon at the SGD control gate layers. Step 905 includes performing laser thermal anneal of the additional polysilicon to produce crystalline silicon. The first approach is described further in connection with FIG. 10A-10J. Step 906 includes replacing a sacrificial material with metal in the control gate layers.

In a second approach, step 907 includes performing laser thermal anneal of the top portion of the polysilicon channel to produce crystalline silicon. Step 908 includes replacing a sacrificial material with metal in the control gate layers. Step 909 includes forming a void in the SGD control gate layer. Step 911 includes performing epitaxial growth of the polysilicon channel via the void. Step 912 includes performing thermal oxidation of epitaxial growth via the void to form oxide. The second approach is described further in connection with FIG. 11A-11Q.

A third approach uses steps 907, 908 and 909 of the second approach followed by step 910. This step deposits an oxide in the void. The third approach is described further in connection with FIG. 12A-12D.

Step 913 includes forming a contact at a top of the memory holes.

Figure 9B:
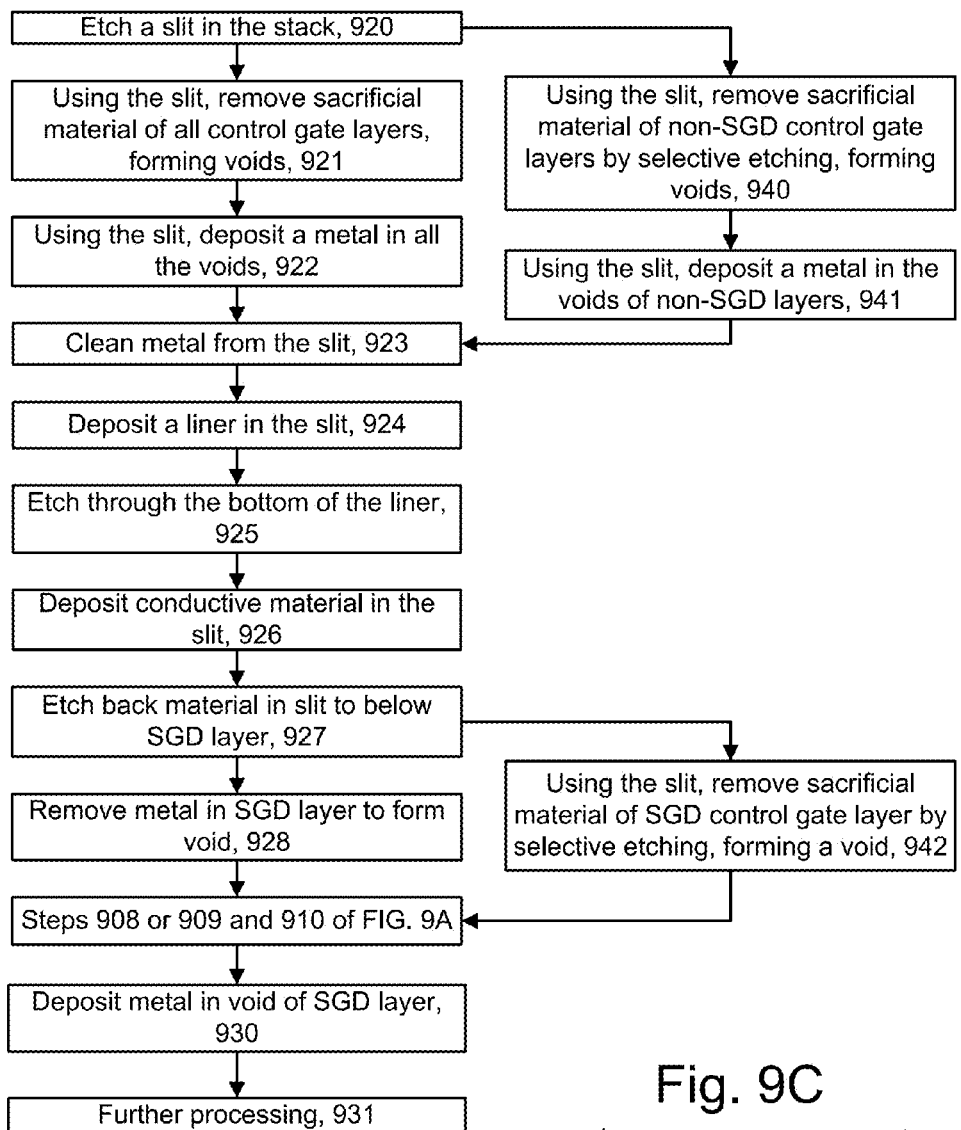
FIG. 9B depicts an example process for replacing a sacrificial material with metal in control gate layers, consistent with steps 906 and 908 of FIG. 9A.

FIG. 9B depicts an example process for replacing a sacrificial material with metal in control gate layers, consistent with steps 906 and 908 of FIG. 9A. Step 920 includes etching a slit in the stack. The slit may be comprise a trench or other void. This can involve etching from the top of the stack to an etch stop material at the bottom of the stack, thereby forming an opening which extends a height of the stack. A portion of the etch stop material may be consumed. A remainder of the etch stop material may be removed via the slit, so that the slit extends down to the substrate dielectric. The memory holes may be covered by a mask during the etching of the slit. Step 921 includes using the slit to remove sacrificial material of all control gate layers, forming voids. For example, the sacrificial material of the control gate layers can be removed by wet etching, creating voids between the dielectric layers of the stack. Step 922 includes using the slit to deposit a metal (e.g., tungsten) in all the voids. Step 923 includes cleaning metal from the slit, e.g., to avoid a short circuit between the control gate layers.

Step 924 includes depositing a liner (e.g., SiO2 or other oxide) in the slit. This isolates the stack layers from the metal or doped polysilicon which will be provided in the slit. Step 925 includes etching through the bottom of the liner. This provides a conductive path to an area below the slit. Step 926 includes depositing a conductive material in the slit, such as metal or doped polysilicon. This provides a conductive vertical interconnect through the stack. Step 927 includes etching back the material in the slit to below the SGD layer. This allows the SGD layer to be accessed with an etchant. Step 928 includes removing the metal in the SGD layer to form a void. This allows the materials in the memory hole to be accessed from their back side, opposite the front side which faces inward toward a center of the memory hole. Subsequently, step 910 or 911 and 912 of FIG. 9A are performed. Step 930 includes depositing metal (or doped polysilicon) in the void of the SGD layer. This extends the conductive via to the top of the stack. Step 931 includes further processing, such as removing excess metal from above the stack.

In one alternative, steps 940 and 941 are performed instead of step 922. Step 940 includes using the slit to remove sacrificial material of non-SGD control gate layers by selective etching, thereby forming voids. Step 941 includes using the slit to deposit a metal in the voids of the non-SGD layers. In this alternative, step 942 includes using the slit to remove sacrificial material of the SGD control gate layer by selective etching, thereby forming a void. See FIG. 11K. Step 942 is performed instead of step 928.

Figure 9C:
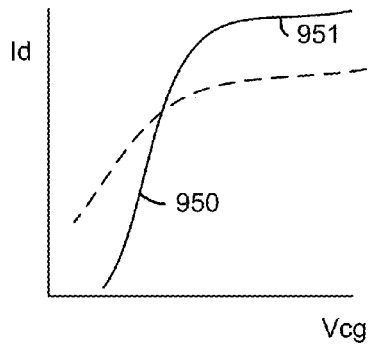
FIG. 9C depicts a plot of drain current versus control gate voltage for a SGD transistor.

FIG. 9C depicts a plot of drain current versus control gate voltage for a SGD transistor. The solid line 950 represents a SGD transistor with a channel of single crystal silicon while the dashed line 951 represents a SGD transistor with a channel of amorphous silicon or polysilicon. A sharper transition between the on and off states is provided with the single crystal silicon.

The following figures depict a straight NAND string but are applicable as well to a U-shaped NAND string as well as other configurations including those which include a vertically extending channel.

FIG. 10A-10J describe an example implementation of the first approach of FIG. 9A.

Figure 10A:
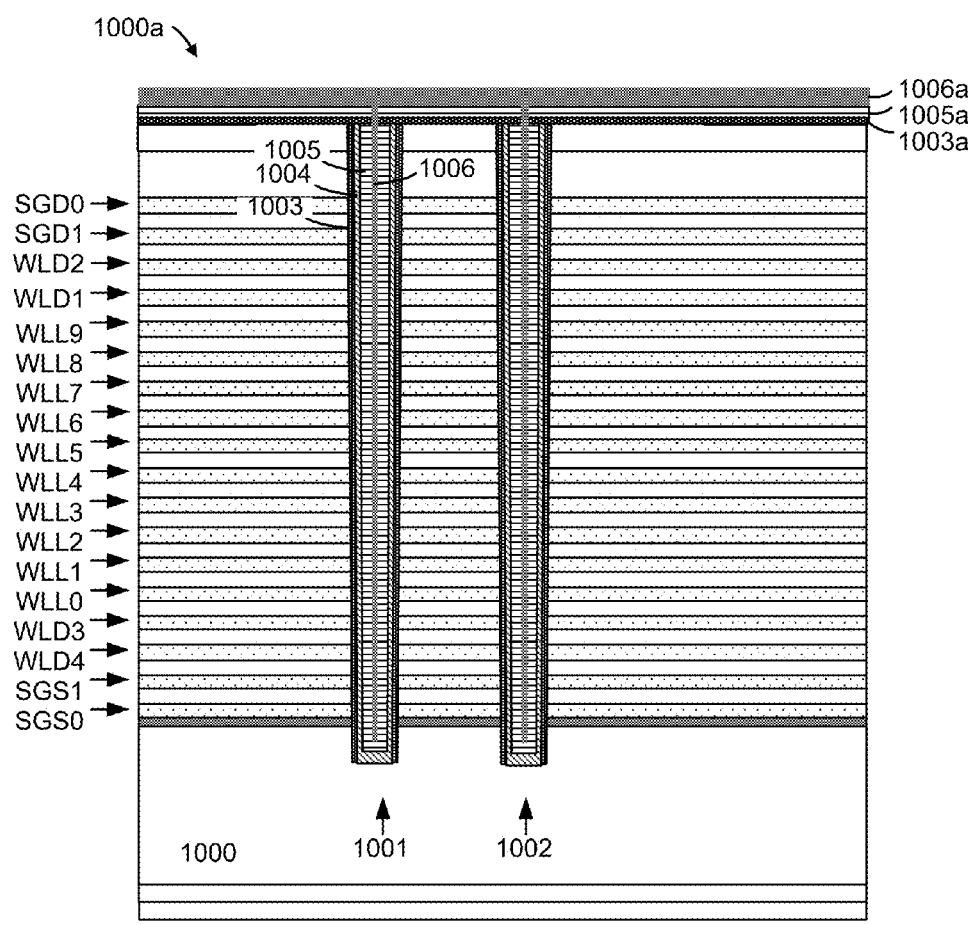

FIG. 10A depicts a stack 1000a in an initial configuration. The stack is similar to the stack of FIG. 3 but with one less word line. This example include two SGD transistors per NAND string. In practice, one or more can be used. The transistors are associated with SGD layers SGD0 and SGD1. SGD0 is the SGD layer which is closest to the drain end of the NAND string, and SGD1 is the SGD layer which is second closest to the drain end of the NAND string. In this example, the SGD transistors connected to SGD0 are provided with a crystalline silicon channel while the SGD transistors connected to SGD1 are provided with a polysilicon channel. See also FIG. 10J.

The stack includes a substrate 1000, control gate layers SGS0, SGS1, WLD4, WLD3, WLL0-WLL9, WLD1, WLD2, SGD1 and SGD0, and example memory holes 1001 and 1002. After the memory holes are formed, a charge trapping material 1003, a tunnel oxide 1004, a silicon channel 1005 and a dielectric core filler 1006 are deposited. A blanket deposition may be performed such that a charge trapping material 1003a, a silicon channel material 1005a and a dielectric core filler 1006a are deposited on the top of the stack. These materials on the top of the stack are subsequently removed. In one approach, the silicon is in amorphous form and is converted to polysilicon in a subsequent heating process. In another approach, the silicon is in polysilicon form.

Dilute Hydrofluoric (DHF) acid may be used to pre-clean the memory hole followed by vapor drying with isopropyl alcohol (IPA). In one approach, the silicon is undoped amorphous silicon (aSi). The aSi may be partially crystallized and converted to polysilicon by, e.g., heating at 850 C for thirty minutes in nitrogen (N2) gas, followed by an anneal at 1050 C in N2. The core filler may be SiO2 which is deposited at 450 C for thirty minutes using atomic layer deposition (ALD).

FIG. 10B depicts a stack 1000b formed by recessing the core oxide of the stack 1000a of FIG. 10A. The dielectric core filler 1006a on the top of the stack is removed, and a recessed core region 1006c is formed in the memory hole.

Figure 10C:
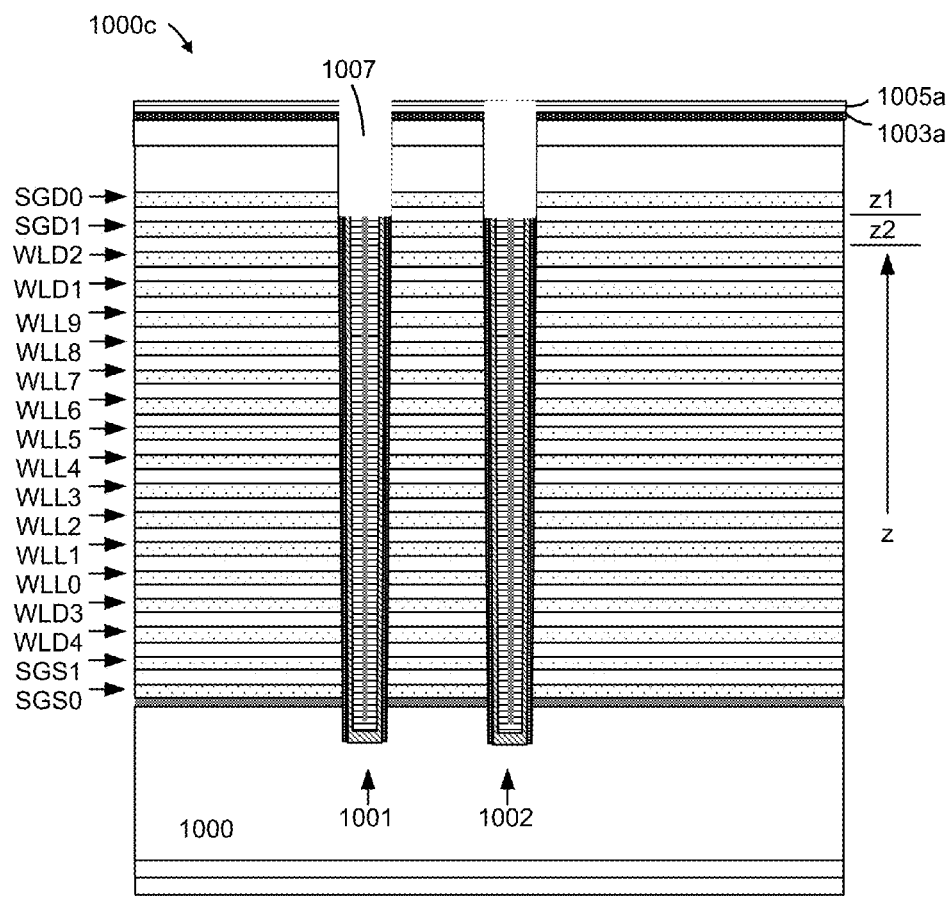

FIG. 10C depicts a stack 1000c formed by etching back the memory films and core oxide of the stack 1000b of FIG. 10B to create an opening or void 1007 at the top of the memory hole. The recessed core region may be filled with polysilicon, followed by recessing the polysilicon and the memory film layers to a height z1 which is below the first SGD layer (SGD0) and above the second SGD layer (SGD1). This approach allows a crystalline silicon channel to be formed for the SGD0 layer but not the SGD1 layer. In another approach, the recess is to a height z2 which is below SGD1 and above WLD2. This approach allows a crystalline silicon channel to be formed for both the SGD0 and SGD1 layers.

Figure 10D:
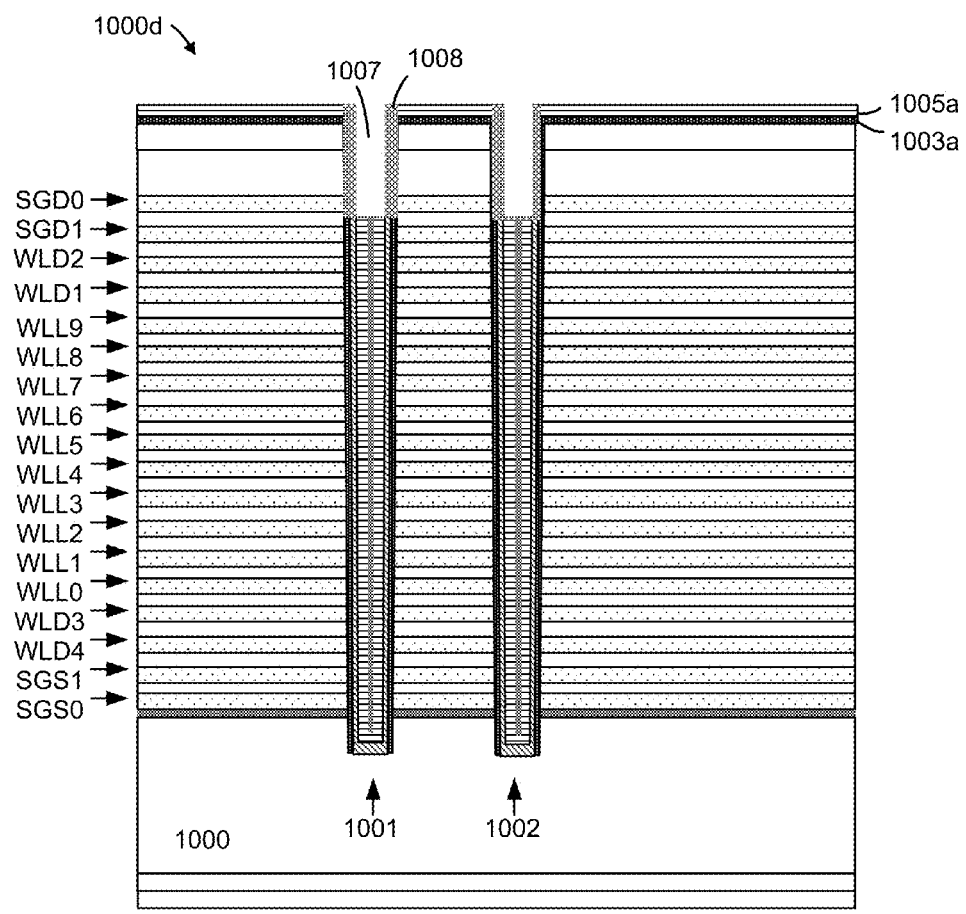

FIG. 10D depicts a stack 1000d formed by depositing a gate oxide 1008 in the opening of the stack 1000c of FIG. 10C. A bottom portion of the gate oxide may be removed so that the polysilicon channel is exposed. The gate oxide can be, e.g., SiO2 deposited by ALD or chemical vapor deposition (CVD). Advantageously, this gate oxide is dedicated for use by the SGD transistors and can be optimized for that purpose. For example, the SGD gate oxide can be thicker than the tunnel oxide of the memory films.

Figure 10E:
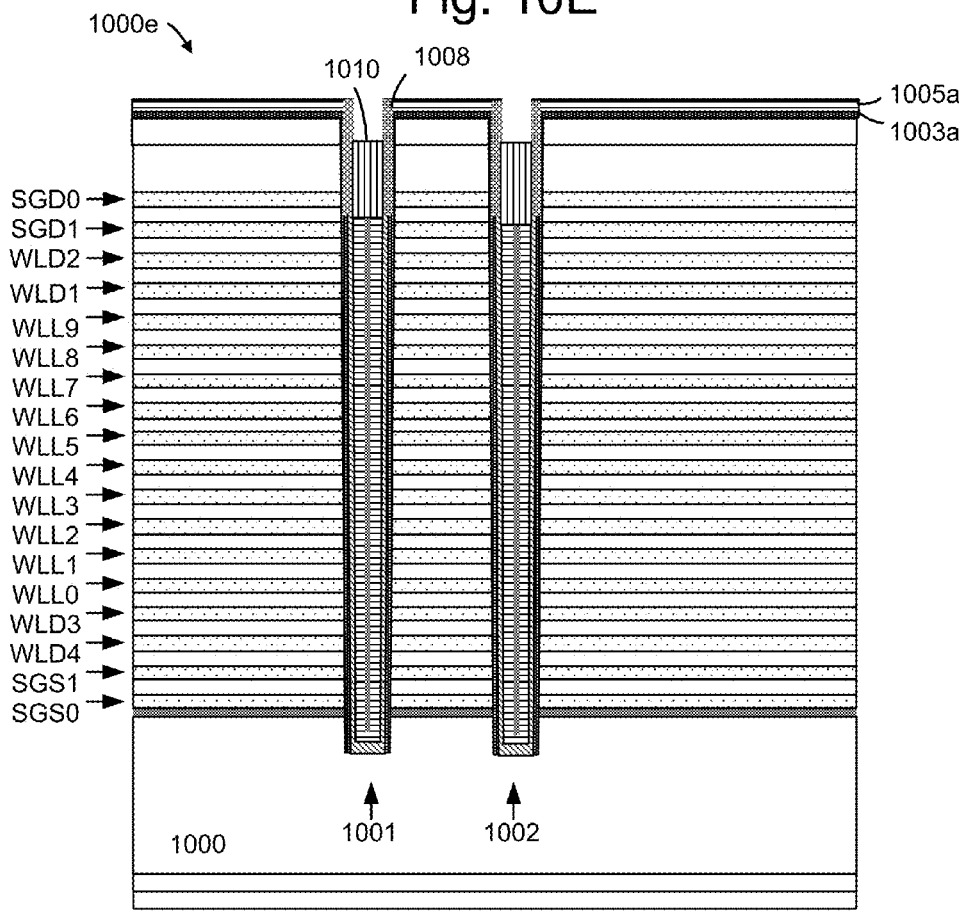

FIG. 10E depicts a stack 1000e formed by providing a closed cylinder of polysilicon in the opening of the stack 1000d of FIG. 10D and performing a laser thermal anneal (LTA) of the polysilicon. The LTA results in a closed cylinder of crystalline silicon 1010. The polysilicon may be doped, e.g., with Boron to enhance its conductivity. The polysilicon does not completely fill the memory holes so that there is room to provide a contact at the top of the memory hole. The polysilicon can be filled to a desired height, or overfilled then etched back. The polysilicon can be deposited by lower pressure CVD (LPCVD), for example. The polysilicon can be doped in situ, e.g., during its deposition, or later, e.g., using ion implantation. Or, the polysilicon may be undoped.

The LTA should be configured to at least convert the polysilicon to crystalline silicon in a region adjacent to the SGD0 layer and extending a height of the SGD0 layer. The crystalline silicon should span the control gate layer (e.g., SGD0) for the select gate transistor. That is, a thickness or height of the crystalline silicon should be at least equal to the thickness or height of the SGD layer. The crystalline silicon should be adjacent to the SGD0 layer. This allows the crystalline silicon to acts as a channel of an SGD transistor, where the SGD0 layer is the control gate.

The LTA process can involve aiming a laser at the top of the stack and providing a relative movement of the laser back and forth across rows of memory cells to ensure that the crystallization is uniform. The diameter of the laser beam is smaller than the memory hole diameter. The regions between the memory holes are oxide so they are not affected by the laser light. In an example implementation, the laser is a pulse laser operating at a wavelength of 308 nm with a pulse duration of less than 200 nsec. The grain size of the silicon crystals is a function of the duration of the laser treatment. LTA provides a better result than rapid thermal annealing (RTA), for instance. RTA involves heating over a long period which could be detrimental to peripheral devices. LTA provides short bursts of energy which do not damage the memory device.

In an example implementation, the LTA process may be configured so that the grain size is larger than the SGD layer thickness. The crystalline silicon channel may comprise a single silicon crystal, e.g., with a grain size of about 100 nm, such that the SGD transistor acts as a single crystal MOSFET. The performance of the SGD transistor depends more on the grain size relative to the SGD layer thickness than on the crystalline fraction of the silicon channel. The polycrystalline silicon may be fully crystalized or converted to a grain size which is larger than the SGD layer thickness, typically 100 nm.

Figure 10F:
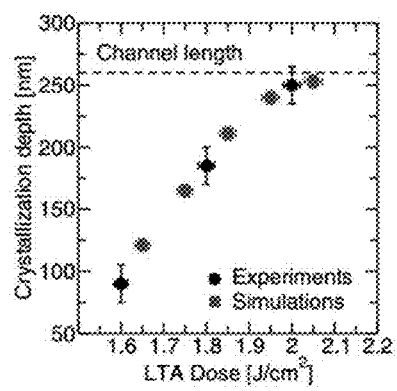

FIG. 10F depicts a plot of crystallization depth versus LTA dose. Generally, the laser dose can be set according to a desired depth in the stack for the crystallization. With an example dose of about 2 J/cm2, the crystallization depth is 250 nm. The laser depth may be limited to about 400 nm which is less than the memory hole depth of, e.g., 4-6 µm. This plot is from Lisoni et al., "Laser thermal anneal of polysilicon channel to boost 3D memory performance," in 2014 Symposium on VLSI Technology Digest of Technical Papers, pp. 1-2, Jun. 9-12, 2014.

Figure 10G:
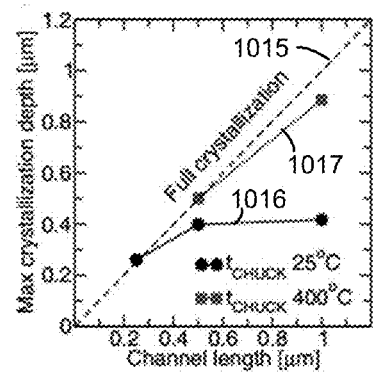

FIG. 10G depicts a plot of maximum crystallization depth versus channel length. A dashed line 1015 indicates the case of full crystallization. A line 1016 indicates the case of a chuck temperature of 25 C and a line 1017 indicates the case of a chuck temperature of 400 C. The crystallization depth can be increased by heating the substrate on a chuck. This plot is from the above-mentioned paper of Lisoni et al.

Figure 10H:
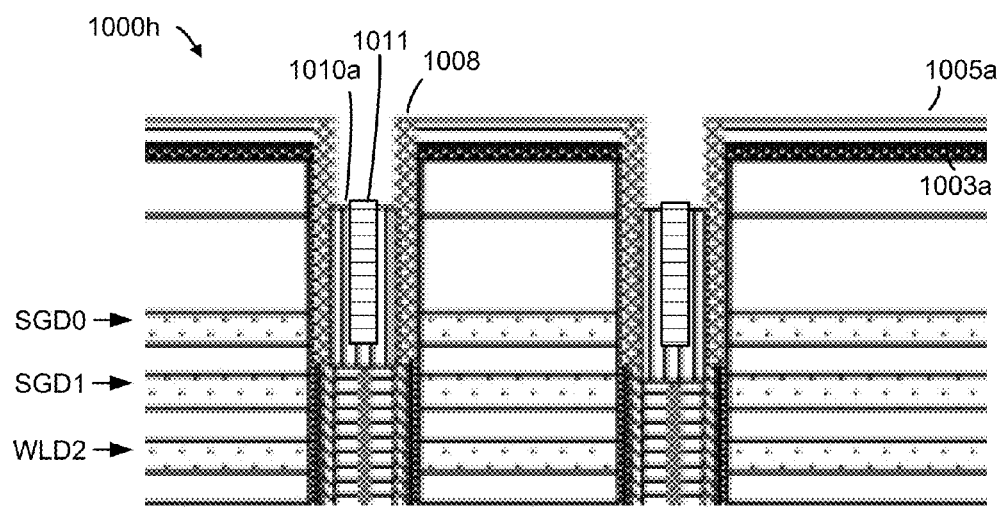

FIG. 10H depicts a stack 1000h formed by providing an open cylinder of polysilicon with a core oxide 1011 in the opening of the stack 1000d of FIG. 10D and performing a laser thermal anneal of the polysilicon, as an alternative to FIG. 10E. An open cylinder of crystalline silicon 1010a is formed. This may result in reduced leakage compared to a closed cylinder of crystalline silicon since it restricts the channel to a thin body. A close-up view of a portion of a stack is shown.

Figure 10I:
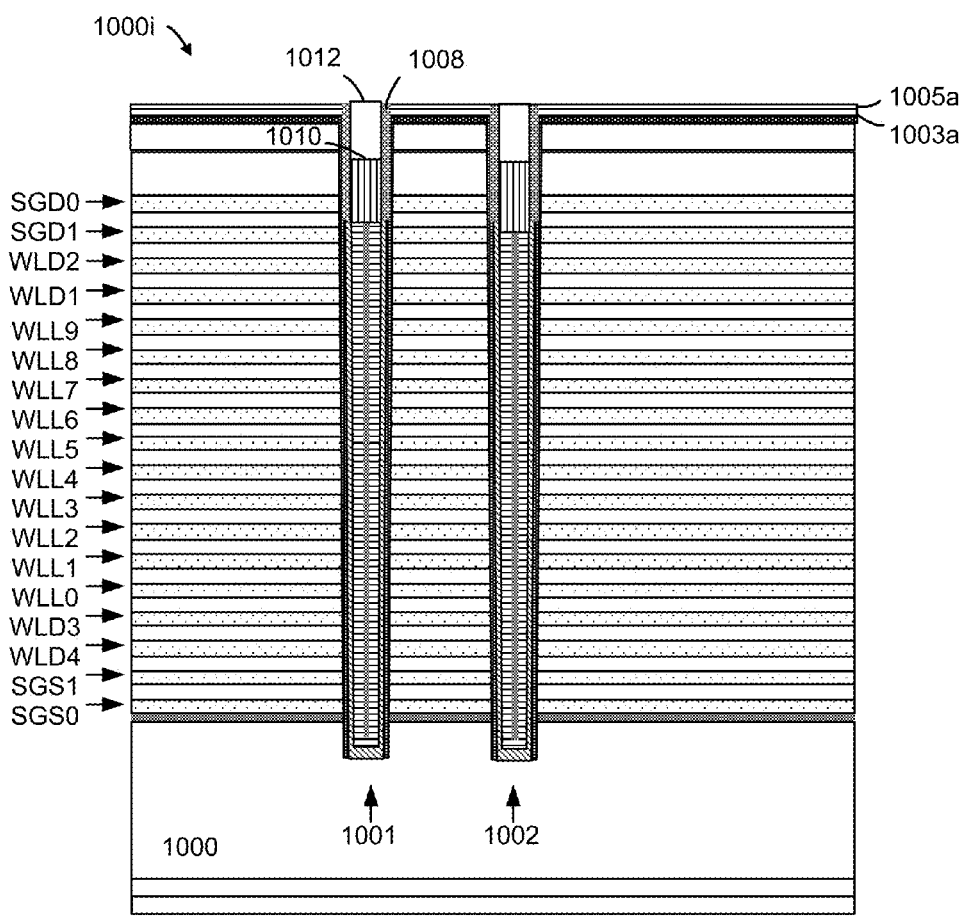

FIG. 10I depicts a stack 1000i formed by providing a polysilicon contact 1012 in the opening of the stack 1000e of FIG. 10E. The contact may be provided on top of the crystalline silicon 1010 to provide a conductive path to a conductive via which extends above the stack. For example, see the conductive via 621 in FIG. 3 which connects the drain-end of a NAND string to a bit line in FIG. 3. The contact may be doped with phosphorus, for example.

The contact may be a doped polysilicon contact provided above the crystalline silicon, wherein the doped polysilicon contact extends from the crystalline silicon to a top of the memory hole.

Figure 10J:
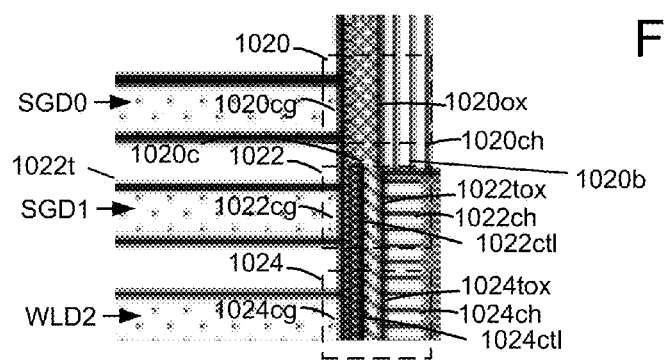

FIG. 10J depicts a close-up view of the select gate transistors of FIG. 10I. A select gate transistor 1020 includes a control gate 1020cg formed from SGD0, a gate oxide 1020ox and a crystalline silicon channel 1020ch. An additional select gate transistor 1022 includes a control gate 1022cg formed from SGD1, a charge trapping layer 1022ctl, a tunnel oxide 1022tox and a polysilicon channel 1022ch. A dummy memory cell 1024 may have a similar configuration as data memory cells and includes a control gate 1024cg formed from WLD2, a charge trapping layer 1024ctl, a tunnel oxide 1024tox and a polysilicon channel 1024ch.

In this example, the select gate transistor 1020 is a topmost select gate transistor among a plurality of select gate transistors at a top of the NAND string, the additional select gate transistor 1022 is provided below the topmost select gate transistor, the memory films extend to a height of the additional select gate transistor, a bottom 1020b of the crystalline silicon is above a top 1022t of the additional select gate transistor, and a bottom 1020c of the gate oxide 1020ox is above the top 1022t of the additional select gate transistor.

Figure 11A:
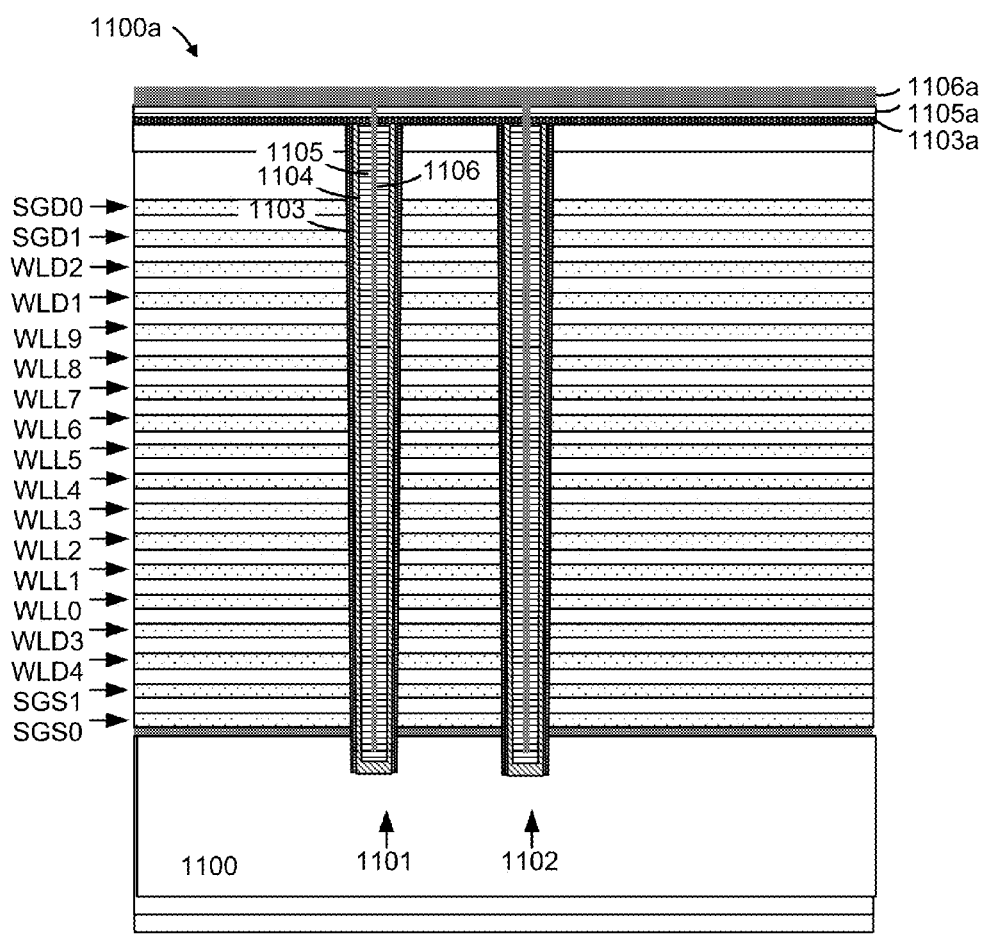
FIG. 11A-11Q describe the second approach of FIG. 9A.
Figure 11C:
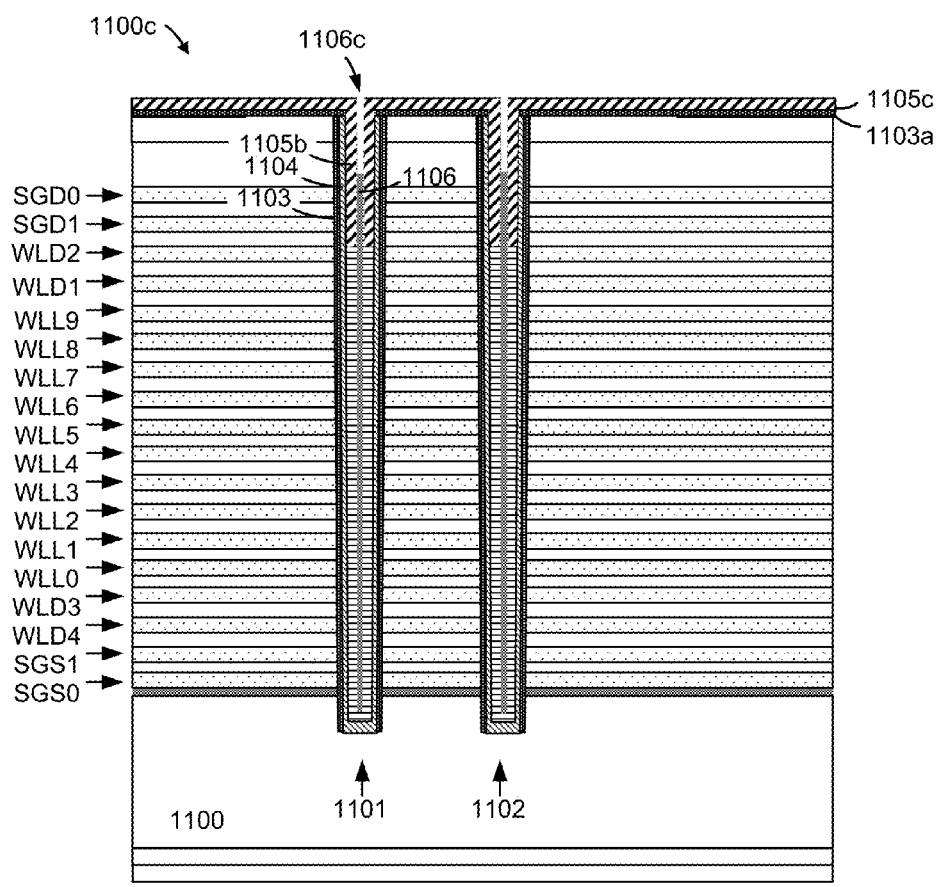
FIG. 11C depicts a stack 1100c formed by performing an LTA of the polysilicon of the stack 1100b of FIG. 11B to provide crystalline silicon.
Figure 11D:
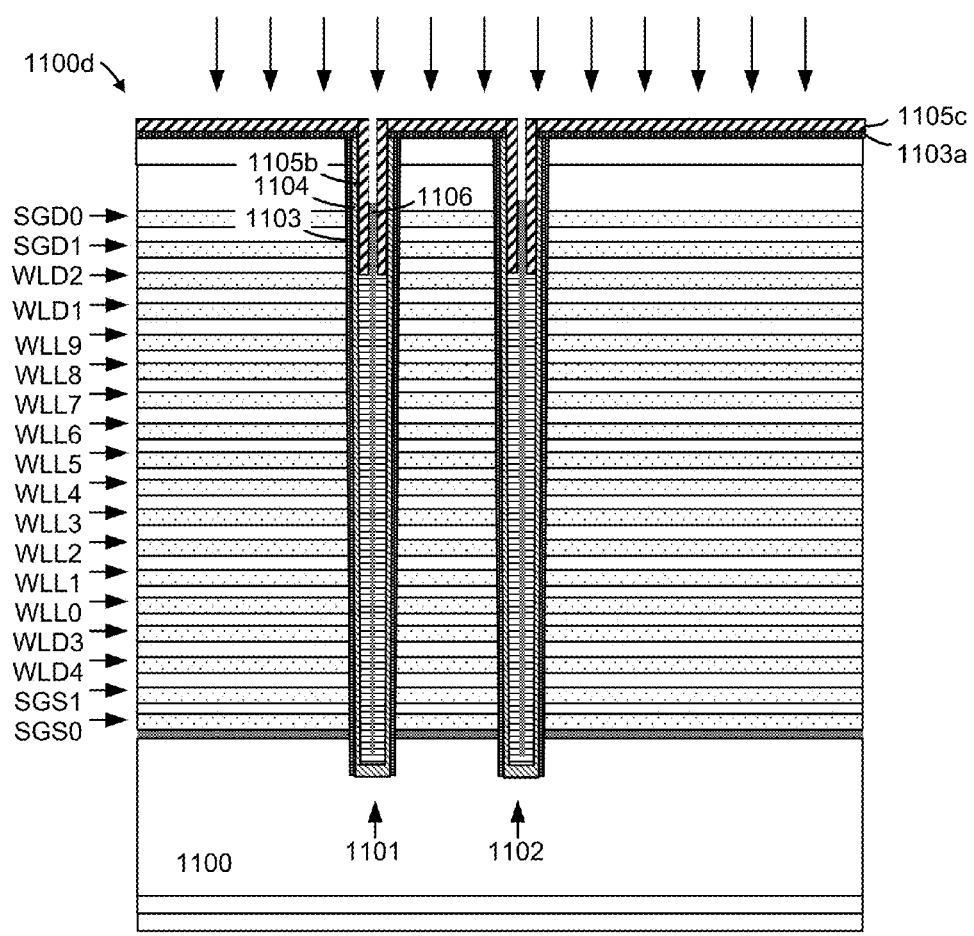
FIG. 11D depicts a stack 1100d formed by doping the crystalline silicon of the stack 1100c of FIG. 11C.
Figure 11E:
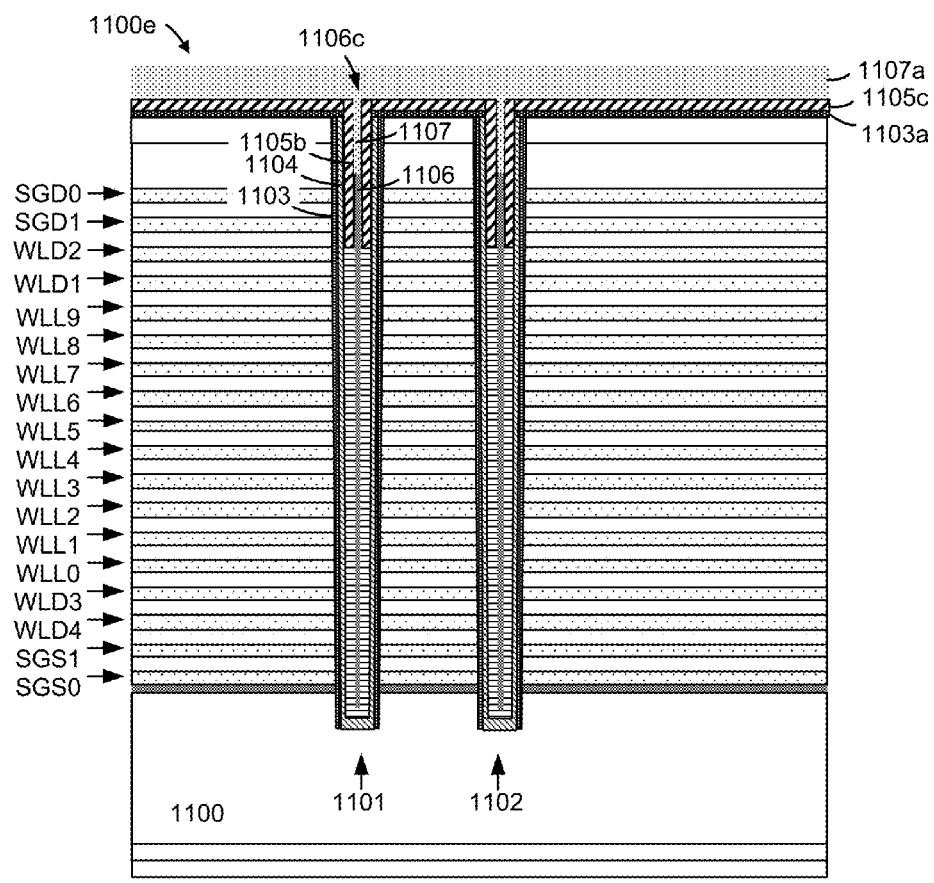
FIG. 11E depicts a stack 1100e formed by depositing polysilicon on the stack 1100d of FIG. 11D to fill a core opening in the memory hole.
Figure 11F:
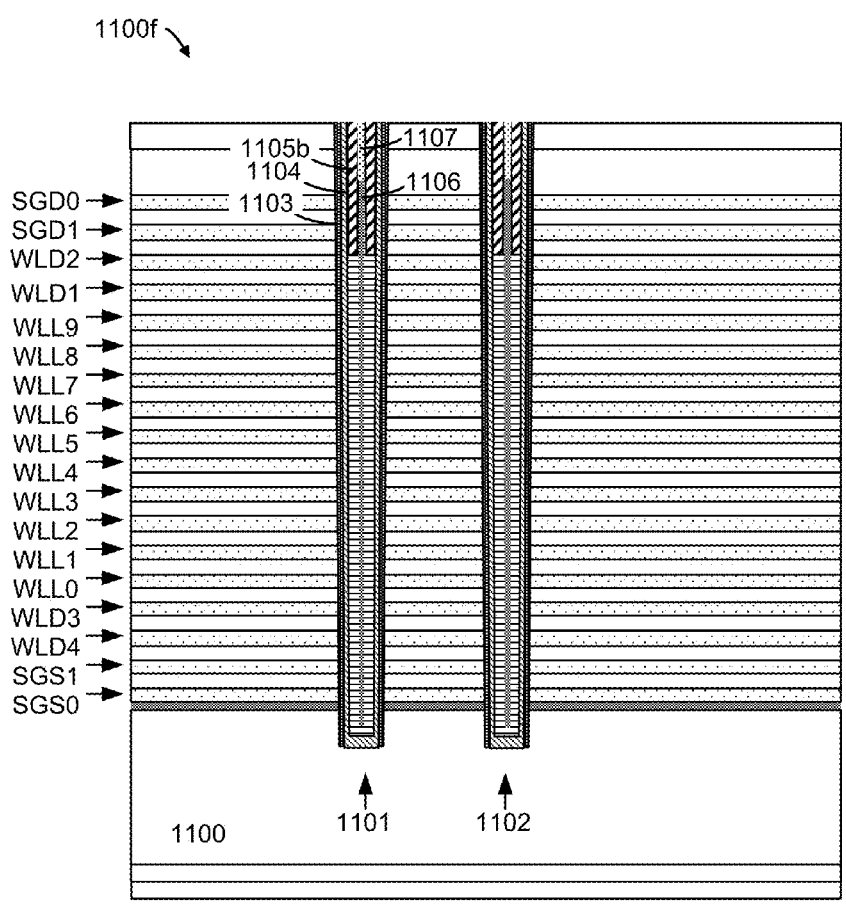
FIG. 11F depicts a stack 1100f formed by cleaning the polysilicon region 1107a, the crystalline silicon 1105c and the charge trapping material 1103a from the top of the stack 1100e of FIG. 11E.
Figure 11G:
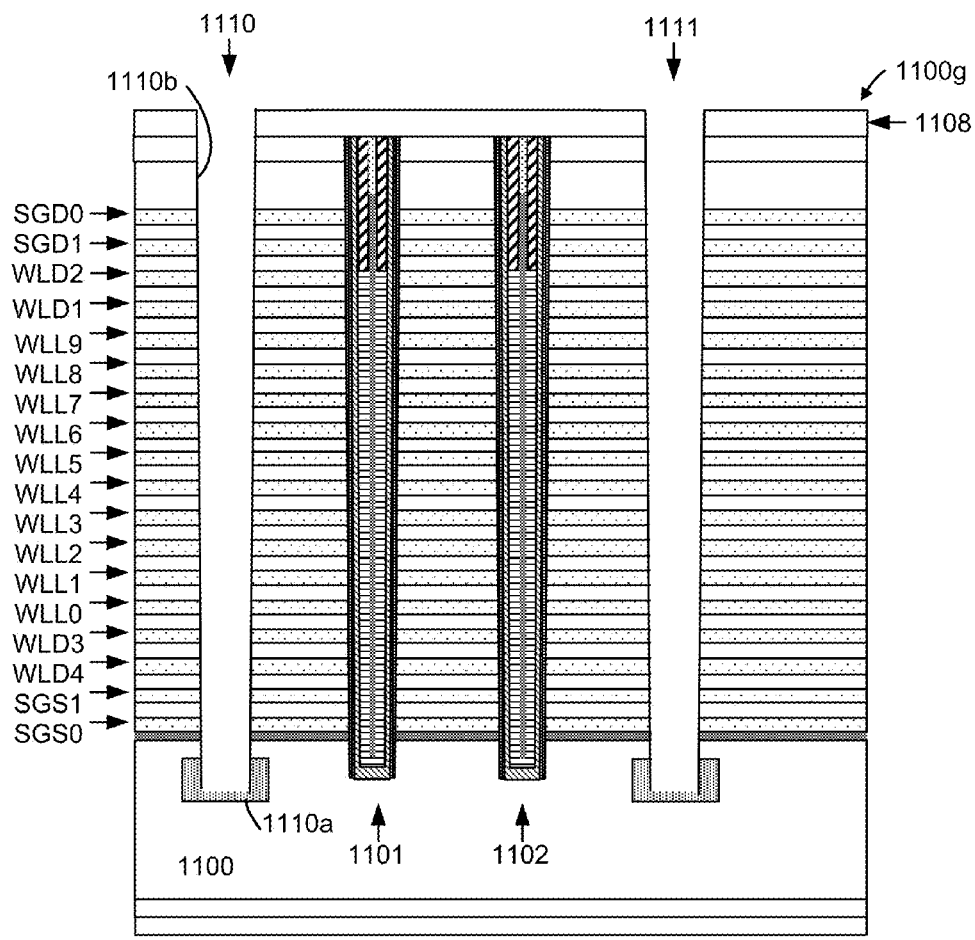
FIG. 11G depicts a stack 1100g formed by etching slits in the stack 1100f of FIG. 11F.
Figure 11H:
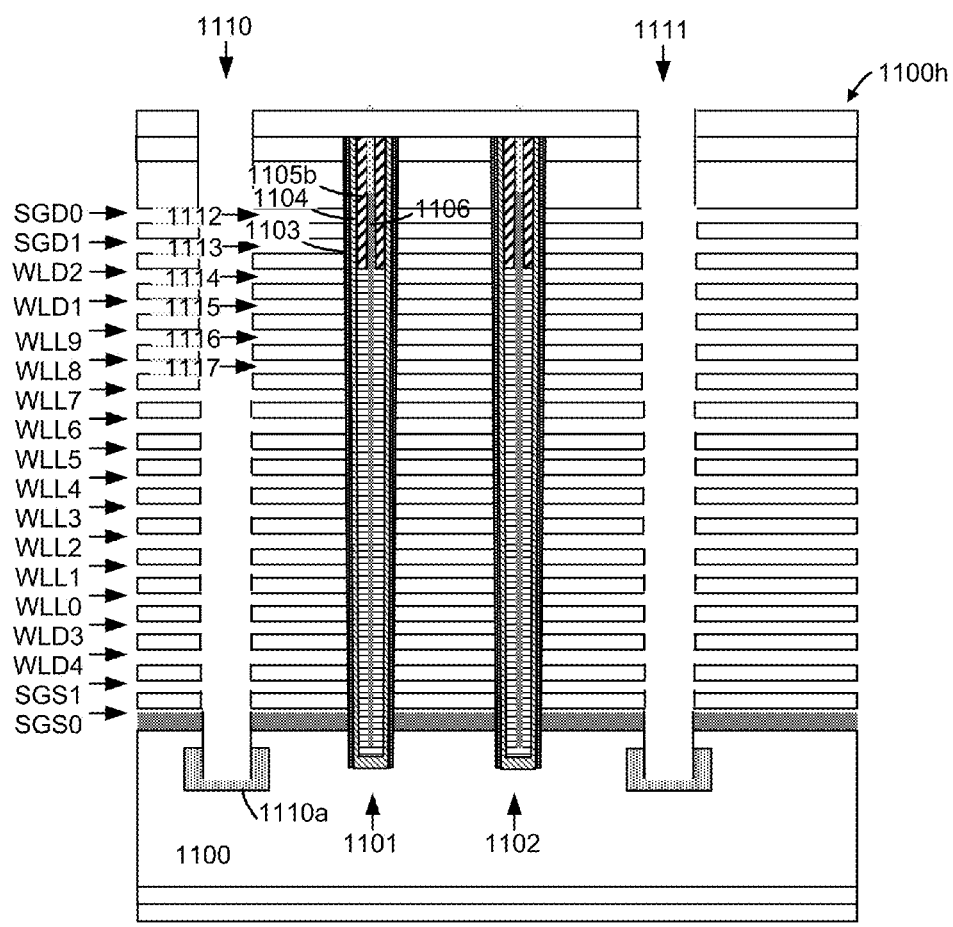
FIG. 11H depicts a stack 1100h formed by removing sacrificial material from the control gate layers of the stack 1100g of FIG. 11G.
Figure 11I:
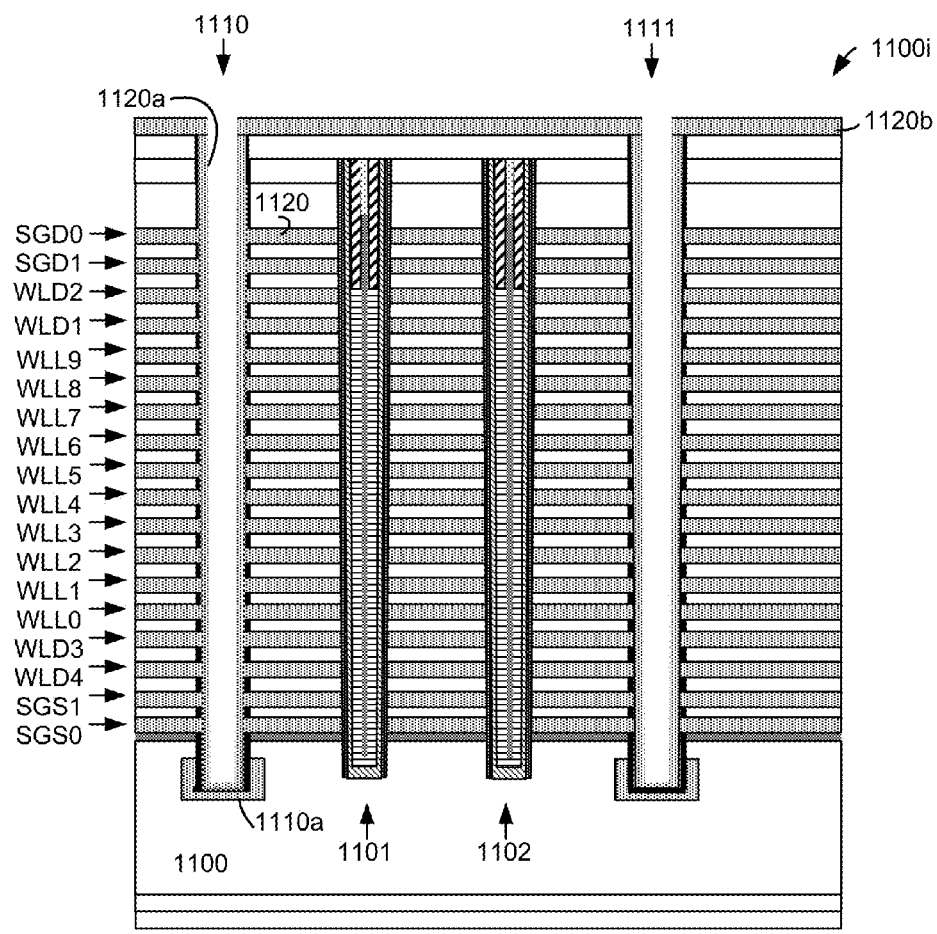
FIG. 11I depicts a stack 1100i formed by depositing oxide and then metal in the stack 1100h of FIG. 11H.
Figure 11K:
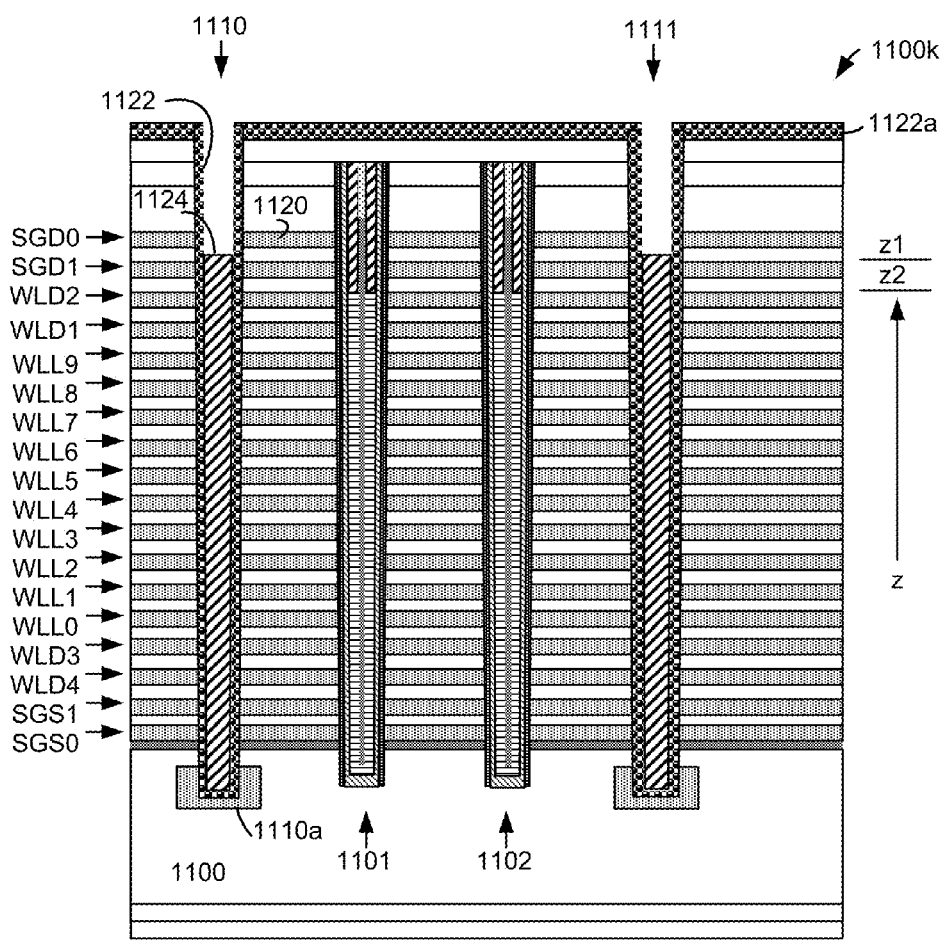
FIG. 11K depicts a stack 1100k formed by providing a conductive material in the slits at a height which is below an SGD control gate layer, in the stack 1100j of FIG. 11J.
Figure 11L:
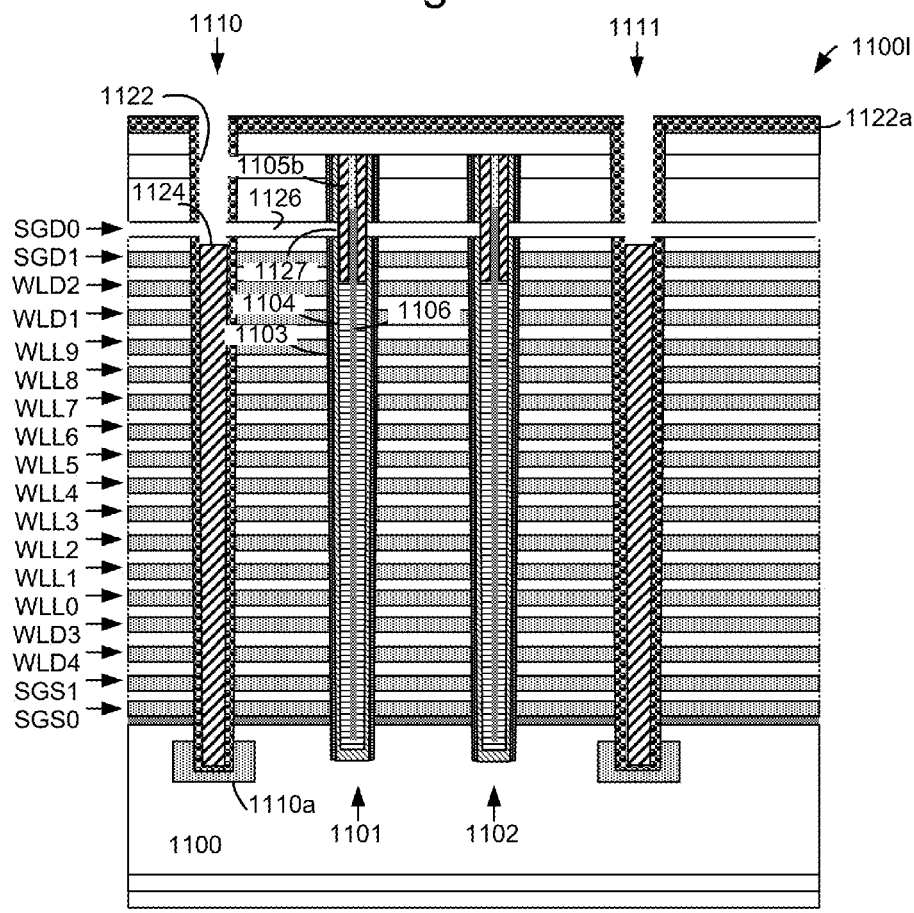
FIG. 11L depicts a stack 1100l formed by providing a void in the SGD control gate layer in the stack 1100k of FIG. 11K.
Figure 11P:
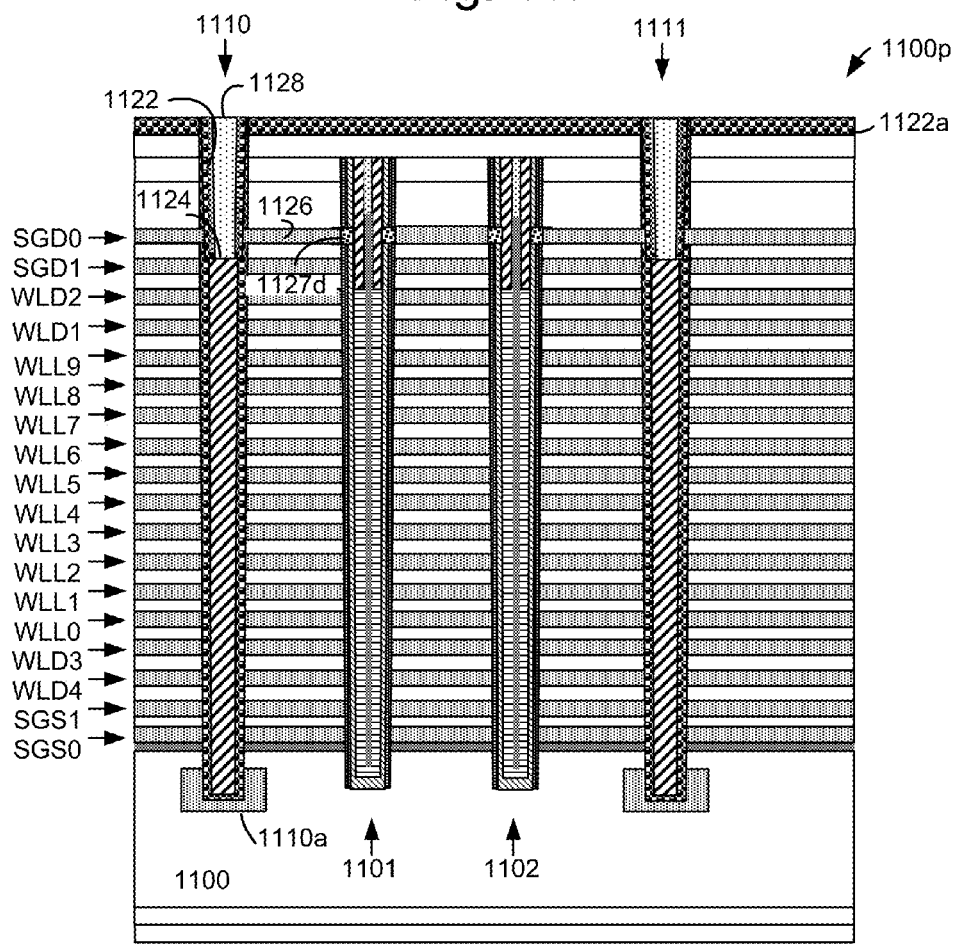
FIG. 11P depicts a stack 1100p formed by filling a remainder of the slit with a conductive material in the stack 1100o of FIG. 11O.
Figure 11Q:
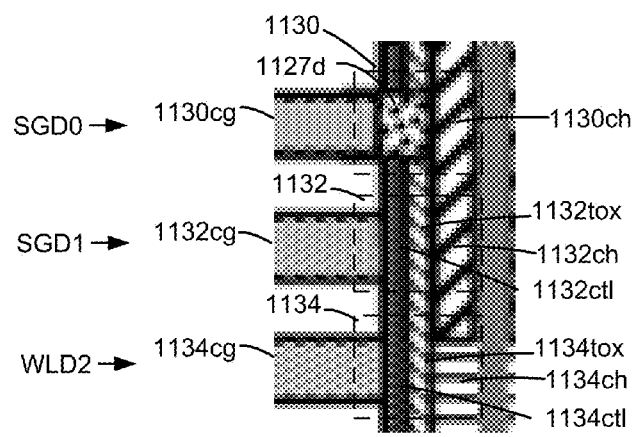

FIG. 11A-11Q describe an example implementation of the second approach of FIG. 9A. This approach provides a thermally grown oxide which has a better quality than a deposited oxide. This results in better controllability of the SGD transistor.

FIG. 11A depicts a stack 1100a in an initial configuration (same as the stack 1000a of FIG. 10A). The stack includes a substrate 1100, control gate layers SGS0, SGS1, WLD4, WLD3, WLL0-WLL9, WLD1, WLD2, SGD1 and SGD0, and example memory holes 1101 and 1102. After the memory holes are formed, a charge trapping material 1103, a tunnel oxide 1104, a silicon channel 1105 and a dielectric core filler 1106 are deposited. A blanket deposition may be performed such that a charge trapping material 1103a, a tunnel oxide 1104, a silicon channel material 1105a and a dielectric core filler 1106a are deposited on the top of the stack. These materials on the top of the stack are subsequently removed. In one approach, the silicon is in amorphous form and is converted to polysilicon in a subsequent heating process. In another approach, the silicon is in polysilicon form.

FIG. 11B depicts a stack 1100b formed by recessing the core oxide of the stack 1100a of FIG. 11A (same as the stack 1000b of FIG. 10B). The dielectric core filler 1106a on the top of the stack is removed, and a recessed core region 1106c is formed in the memory hole.

FIG. 11C depicts a stack 1100c formed by performing an LTA of the polysilicon of the stack 1100b of FIG. 11B to provide crystalline silicon. The LTA changes the silicon 1105 in the memory films to crystalline silicon 1105b, and changes the silicon 1105a on top of the stack to crystalline silicon 1105c.

FIG. 11D depicts a stack 1100d formed by doping the crystalline silicon of the stack 1100c of FIG. 11C. The downward arrows represent doping by ion implantation, e.g., using Boron. The doping of the crystalline silicon 1105b in the memory hole can be set at a desired concentration. Moreover, the depth of the doping can be set based on the implantation energy. For example, the depth can include the SGD transistors of the SGD1 layer which have a charge trapping layer, in this example. The doping can adjust a Vth of these SGD transistors.

FIG. 11E depicts a stack 1100e formed by depositing polysilicon on the stack 1100d of FIG. 11D to fill a core opening in the memory hole. The polysilicon may be doped with phosphorus, for example. This polysilicon is part of a contact at the top of the memory hole and should have a high conductivity. A core filler polysilicon 1107 is formed in the core of the memory hole and another region 1107a of polysilicon is formed on top of the stack due to a blanket deposition.

FIG. 11F depicts a stack 1100f formed by cleaning the polysilicon region 1107a, the crystalline silicon 1105c and the charge trapping material 1103a from the top of the stack 1100e of FIG. 11E. For example, a reactive ion etch (RIE) may be used.

FIG. 11G depicts a stack 1100g formed by etching slits in the stack 1100f of FIG. 11F. The slits 1110 and 1111 may be used to replace a sacrificial material in the control gate layers and to provide a conductive interconnect which extends through the stack, as depicted, e.g., in FIGS. 6 and 7. The slit 1110 extends down to a diffusion region 1110a in the substrate. An etch stop material, not shown, may also be used. The slit 1110 has an example sidewall 1110b. A cap layer or mask of aSi 1108 may be used to shield the memory holes. This mask will be worn down by the etching and a residue of it may be later removed to expose the top portions of the memory holes.

FIG. 11H depicts a stack 1100h formed by removing sacrificial material from the control gate layers of the stack 1100g of FIG. 11G. For example, the sacrificial material may be SiN. A wet etch may be used. Voids are formed in the control gate layers which extend to a back side of the charge trapping material 1103. For example, voids 1112, 1113, 1114, 1115, 1116 and 1117 are formed in SGD0, SGD1, WLD2, WLD1, WLL9 and WLL8, respectively.

FIG. 11I depicts a stack 1100i formed by depositing oxide and then metal in the stack 1100h of FIG. 11H. For example, a layer of SiO2 may be followed by a barrier metal layer of AlO and a tungsten (or other metal) filler. The tungsten fills the voids in the control gate layers (including a tungsten portion 1120 in the SGD0 layer) and lines the slit (including a tungsten portion 1120a). The slit may be wider than the control gate layers, in one approach. A tungsten portion 1120b is deposited on top of the stack due to the blanket deposition FIG. 11J depicts a stack 1100j formed by removing metal from the slits and depositing an oxide liner 1122 in the stack 1100i of FIG. 11I. The metal in the slit is removed and replaced with oxide to avoid a short circuit between the metal in the different control gate layers. An oxide portion 1122a is also formed on top of the stack.

FIG. 11K depicts a stack 1100k formed by providing a conductive material 1124 in the slits at a height which is below an SGD control gate layer, in the stack 1100j of FIG. 11J. For example, doped polysilicon or metal may be provided in the slits. The conductive material may be provided at a height z1 which is between SGD0 and SGD1, for example. The conductive material may be filled to this level or overfilled and etched back. Since the top part of the slit is open, an etchant can be introduced which acts on the SGD0 layer but not the other control gate layers. In this case, the etchant removes the metal in the SGD0 layer as well as portions of the charge trapping material 1103 and the tunnel oxide 1104 in the SGD0. The void exposes the back side of the crystalline silicon 1105b.

An alternative approach as mentioned at step 942 of FIG. 9B includes using the slit to remove sacrificial material of the SGD control gate layer by selective etching. In one approach, the stack is formed using a first sacrificial material for the SGD control gate layers and a second sacrificial material for the remaining control gate layers. When a slit is formed in the stack, an etchant can be introduced initially which is more selective of the second sacrificial material than of the first sacrificial material. This removes the sacrificial material from the remaining control gate layers but not from the SGD control gate layers. After a metal is provided in the remaining control gate layers, an etchant can be introduced which is selective of the first sacrificial material. This allows a void to be created in the SGD0 layer, for example, as discussed. For example, the first sacrificial material can comprise polysilicon while the second sacrificial material can comprise silicon nitride.

FIG. 11L depicts a stack 1100l formed by providing a void 1126 in the SGD control gate layer in the stack 1100k of FIG. 11K. A back side 1127 of the crystalline silicon is exposed.

FIG. 11M depicts a stack 1100m formed by epitaxially growing silicon from a back side of the crystalline silicon in the memory hole, in the stack 1100l of FIG. 11L. An epitaxial silicon portion 1127a is depicted as extending sideways into the void 1126. For example, vapor phase epitaxy may be used. In one example, silane (SiH4) pyrolysis is used according to the formula: SiH4 (H2)→Si+2H2 at 800-1100 C.

FIG. 11N depicts a stack 1100n formed by thermally oxidizing the epitaxially grown silicon in the stack 1100m of FIG. 11M. The epitaxial silicon portion 1127a is oxidized to become an oxidized region 1127b. For example, an oxygen containing gas may be introduced at 800 C for thirty minutes.

FIG. 11O depicts a stack 1100o formed by depositing a metal in the void of the SGD control gate layer, in the stack 1100m of FIG. 11M. A metal portion 1126a is provided in the SGD0 layer. A barrier metal may also be deposited. DHF acid may be used to clean up the oxide in the slit. This may result in recessing the oxidized region 1127b to form an oxidized region 1127c.

FIG. 11P depicts a stack 1100p formed by filling a remainder of the slit with a conductive material 1128 in the stack 1100o of FIG. 11O. For example, if the conductive material 1124 is polysilicon, the top of the polysilicon may be cleaned, another liner may be deposited to cover the metal in the SGD0 layer, and the additional conductive material 1128 added. The additional conductive material may be metal or polysilicon, for example.

Optionally, the crystalline silicon is a closed cylinder instead of an open cylinder as depicted.

FIG. 11Q depicts a close-up view of the select gate transistors of FIG. 11P. In this example, the crystallized silicon 1105b extends down to a height in the stack which is between SGD1 and WLD2. A select gate transistor 1130 includes a control gate 1130cg formed from SGD0, a gate oxide 1127d and a crystalline silicon channel 1130ch. A select gate transistor 1132 includes a control gate 1132cg formed from SGD1, a charge trapping layer 1132ctl, a tunnel oxide 1132tox and a crystalline silicon channel 1132ch. A dummy memory cell 1134 may have a similar configuration as data memory cells and includes a control gate 1134cg formed from WLD2, a charge trapping layer 1134ctl, a tunnel oxide 1134tox and a polysilicon channel 1134ch.

FIG. 12A-12D describe an example implementation of the third approach of FIG. 9A.

FIG. 12A depicts a stack 1200a in an initial configuration (same as the stack 1100k of FIG. 11K). The stack includes a substrate 1200, control gate layers SGS0, SGS1, WLD4, WLD3, WLL0-WLL9, WLD1, WLD2, SGD1 and SGD0, and example memory holes 1201 and 1202. The memory holes include a charge trapping material 1203, a tunnel oxide 1204, a polysilicon silicon channel 1205, a single crystal silicon 1205a, and dielectric core fillers 1206 and 1207.

Slits 1210 and 1211 are provided. The slit 1210 extends down to a diffusion region 1210a in the substrate. The slit 1210 has an example sidewall 1210b. A conductive material 1224 is provided in the slits at a height which is between SGD0 and SGD1, for example. A metal portion 1226 is provided in the SGD0 layer. An oxide liner 1222 is provided in the slits. An oxide portion 1222a is also formed on top of the stack.

FIG. 12B depicts a stack 1200b formed by providing a void in the SGD control gate layer in the stack 1200a of FIG. 12A (same as the stack 11001 in FIG. 11L). A void 1226a is provided in the SGD0 layer. As before, the remaining control gate layers are shielded by the material in the slit below SGD0. Portions of the charge trapping material and the tunnel oxide are removed so that a back side portion 1227 of the crystalline silicon is exposed.

FIG. 12C depicts a stack 1200c formed by depositing an oxide 1228 in the void in the SGD control gate layer in the stack 1200b of FIG. 12B. For example, SiO$_2$ may be deposited using ALD.

Figure 12D:
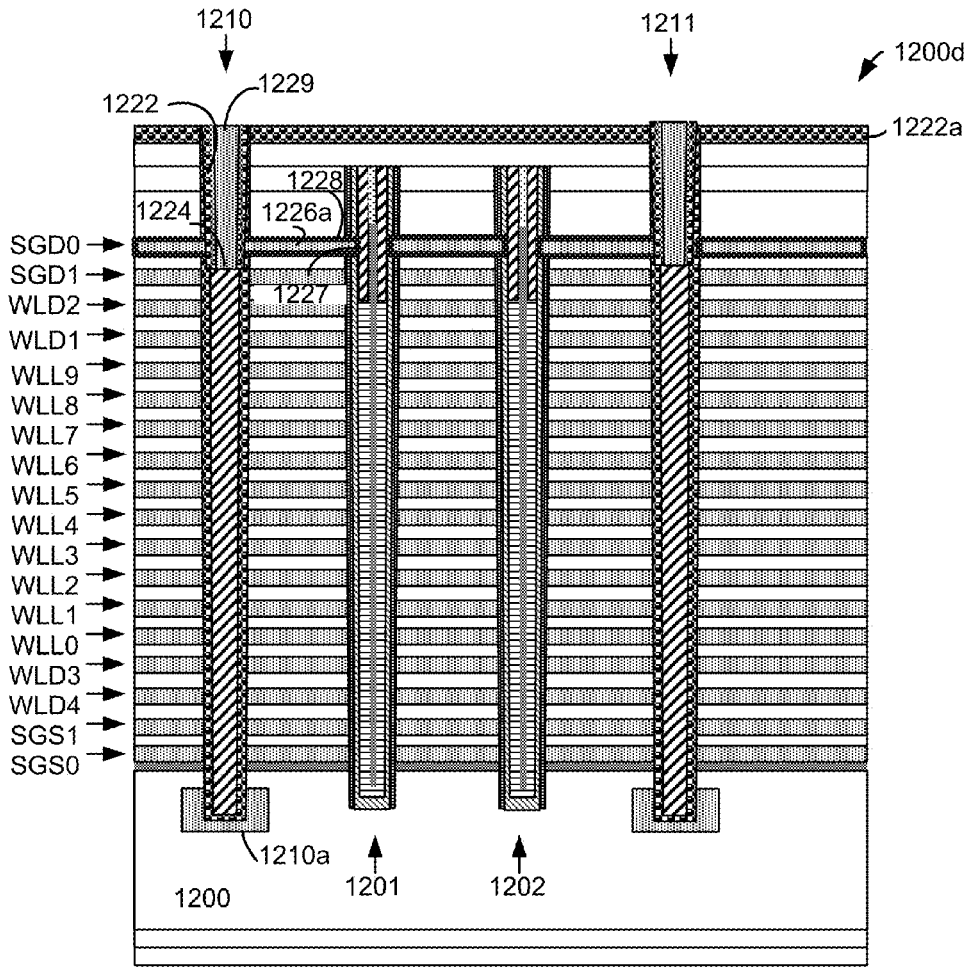

FIG. 12D depicts a stack 1200d formed by filling a remainder of the slit with a conductive material 1229 in the stack 1200c of FIG. 12C. The processing may be similar to that discussed in connection with FIG. 11P.

Figure 12E:
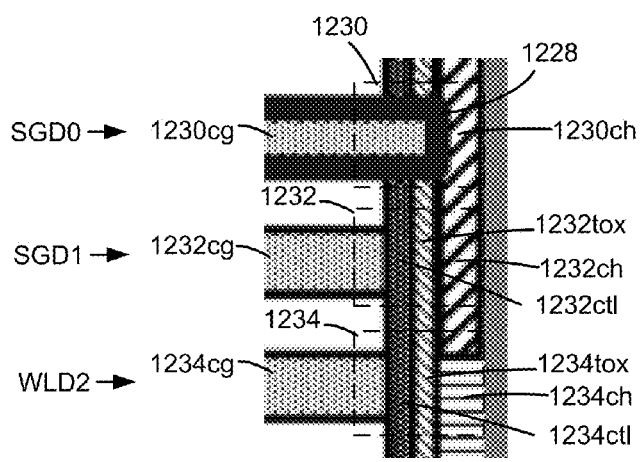
FIG. 12E depicts a close-up view of the select gate transistors of FIG. 12D.

FIG. 12E depicts a close-up view of the select gate transistors of FIG. 12D. In this example, the crystallized silicon 1205b extends down to a height in the stack which is between SGD1 and WLD2. A select gate transistor 1230 includes a control gate 1230cg formed from SGD0, a gate oxide 1228 and a crystalline silicon channel 1230ch. A select gate transistor 1232 includes a control gate 1232*cg* formed from SGD1, a charge trapping layer 1232*ctl*, a tunnel oxide 1232*tox* and a crystalline silicon channel 1232*ch*. A dummy memory cell 1234 may have a similar configuration as data memory cells and includes a control gate 1234*cg* formed from WLD2, a charge trapping layer 1234*ctl*, a tunnel oxide 1234*ox* and a polysilicon channel 1230*ch*.

Accordingly, it can be seen that, in one embodiment, a method for fabricating a memory device comprises: forming a stack comprising alternating control gate layers and dielectric layers, wherein the control gate layers comprise a control gate layer for a select gate transistor of a NAND string above control gate layers for memory cells of the NAND string; etching a memory hole in the stack; providing memory films along a wall of the memory hole adjacent to the control gate layers for the memory cells; providing polysilicon in the memory hole and converting the polysilicon to crystalline silicon using laser thermal annealing, wherein the crystalline silicon spans the control gate layer for the select gate transistor; and providing a metal in the control gate layer for the select gate transistor, wherein the crystalline silicon forms a channel of the select gate transistor, the metal provides a control gate of the select gate transistor and a gate oxide of the select gate transistor is provided between the metal and the crystalline silicon.

In another embodiment, a method for fabricating a memory device comprises: forming a stack comprising alternating control gate layers and dielectric layers, wherein the control gate layers comprise a control gate layer for a select gate transistor above control gate layers for memory cells; etching a memory hole in the stack; providing memory films along a wall of the memory hole adjacent to the control gate layers for the memory cells, wherein the memory films extend up to a top of the stack; deposit a core oxide in the memory holes between the memory films, wherein the core oxide extends up to the top of the stack; etch back the memory films and the core oxide to a level which is below the control gate layer for the select gate transistor, creating an opening at a top of the memory hole; deposit a gate oxide of the select gate transistor along a wall of the memory hole in the opening; providing silicon in the opening, wherein the silicon spans the control gate layer for the select gate transistor; performing a laser thermal annealing process on the silicon to increase a crystal fraction of the silicon; and providing a metal in the control gate layer for the select gate transistor, wherein the silicon forms a channel of the select gate transistor, the metal provides a control gate of the select gate transistor and the gate oxide of the select gate transistor is provided between the metal and the silicon.

In another embodiment, a method for fabricating a memory device comprises: forming a stack comprising alternating control gate layers and dielectric layers, wherein the control gate layers comprise a control gate layer for a select gate transistor above control gate layers for memory cells; etching a memory hole in the stack; providing memory films along a wall of the memory hole adjacent to the control gate layers for the memory cells, wherein the memory films extend up to a top of the stack and comprise a charge-trapping material, a tunnel oxide and a polysilicon channel; performing a laser thermal annealing process on a portion of the polysilicon channel to convert the polysilicon channel to crystalline silicon, wherein the portion of the polysilicon channel spans the control gate layer for the select gate transistor; forming a void in the control gate layer for the select gate transistor; via the void, removing portions of the charge-trapping material and the tunnel oxide adjacent to the control gate layer for the select gate transistor to expose a portion of the crystalline silicon; via the void, performing epitaxial growth of the portion of the crystalline silicon to provide an epitaxial portion of the crystalline silicon; performing thermal oxidation of the epitaxial portion of the crystalline silicon, to provide a gate oxide of the select gate transistor; and via the void, providing a metal in the control gate layer for the select gate transistor, wherein the crystalline silicon forms a channel of the select gate transistor, the metal provides a control gate of the select gate transistor and the gate oxide of the select gate transistor is provided between the metal and the crystalline silicon.

In another embodiment, a corresponding memory device is provided as disclosed herein.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for fabricating a memory device, comprising:
   forming a stack comprising alternating control gate layers and dielectric layers, wherein the control gate layers comprise a control gate layer for a select gate transistor of a NAND string above control gate layers for memory cells of the NAND string;
   etching a memory hole in the stack;
   providing memory films along a wall of the memory hole adjacent to the control gate layers for the memory cells;
   providing polysilicon in the memory hole and converting the polysilicon to crystalline silicon using laser thermal annealing, wherein the crystalline silicon spans the control gate layer for the select gate transistor; and
   providing a metal in the control gate layer for the select gate transistor, wherein the crystalline silicon forms a channel of the select gate transistor, the metal provides a control gate of the select gate transistor and a gate oxide of the select gate transistor is provided between the metal and the crystalline silicon.

2. The method of claim 1, wherein:
   the gate oxide is deposited along the wall of the memory hole adjacent to the control gate layer for the select gate transistor; and
   the polysilicon comprises an open or closed cylinder.

3. The method of claim 2, wherein:
   the memory films are deposited along the wall of the memory hole up to a top of the stack and then etched back to a level which is below a height of the control gate layer for the select gate transistor, to provide an opening for the gate oxide to be deposited along the wall of the memory hole at the height of the control gate layer for the select gate transistor.

4. The method of claim 2, wherein:
   the memory films comprise a charge-trapping material, a tunnel oxide and a polysilicon channel; and
   the gate oxide of the select gate transistor is deposited separately from, and is thicker than, the tunnel oxide of the memory films; and the
   the polysilicon which is converted to crystalline silicon is provided after the polysilicon channel.

5. The method of claim 1, further comprising:
providing a doped polysilicon contact above the crystalline silicon, wherein the doped polysilicon contact extends from the crystalline silicon to a top of the memory hole.

6. The method of claim 1, wherein:
the select gate transistor is a topmost select gate transistor among a plurality of select gate transistors at a top of the NAND string;
an additional select gate transistor is provided below the topmost select gate transistor;
the memory films extend to a height of the additional select gate transistor;
a bottom of the crystalline silicon is above a top of the additional select gate transistor; and
a bottom of the gate oxide is above the top of the additional select gate transistor.

7. The method of claim 1, wherein:
the memory films extend to a height of the select gate transistor;
the memory films comprise a charge-trapping material, a tunnel oxide and a polysilicon channel; and
a portion of the polysilicon channel comprises the polysilicon which is converted to crystalline silicon.

8. The method of claim 7, further comprising:
forming a void in the control gate layer for the select gate transistor;
via the void, removing portions of the charge-trapping material and the tunnel oxide adjacent to the control gate layer for the select gate transistor to expose a portion of the crystalline silicon;
via the void, performing epitaxial growth of the portion of the crystalline silicon to provide an epitaxial portion of the crystalline silicon; and
performing thermal oxidation of the epitaxial portion of the crystalline silicon, to provide the gate oxide of the select gate transistor.

9. The method of claim 8, wherein:
the epitaxial portion of the crystalline silicon extends horizontally into the void.

10. The method of claim 8, further comprising:
providing the metal in the void after the thermal oxidation.

11. The method of claim 8, wherein the forming the void in the control gate layer for the select gate transistor comprises:
forming a slit in the stack;
via the slit, removing sacrificial material in each of the control gate layers to create voids in each of the control gate layers;
via the slit, filling the voids in each of the control gate layers with metal;
filling the slit up to a level which is above a topmost control gate layer among the control gate layers for the memory cells and below the control gate layer for the select gate transistor, so that the control gate layer for the select gate transistor is accessible from the slit; and
via the slit, removing, from the control gate layer for the select gate transistor, a portion of the metal which filled the voids in each of the control gate layers.

12. The method of claim 7, further comprising:
forming a void in the control gate layer for the select gate transistor;
via the void, removing portions of the charge-trapping material and the tunnel oxide adjacent to the control gate layer for the select gate transistor to expose a portion of the crystalline silicon;
providing an oxide liner in the void, a portion of the oxide liner being adjacent to the crystalline silicon, wherein the portion of the oxide liner provides the gate oxide of the select gate transistor; and
providing the metal in the void after the providing of the oxide liner.

13. The method of claim 12, wherein the forming the void in the control gate layer for the select gate transistor comprises:
forming a slit in the stack;
via the slit, removing sacrificial material in each of the control gate layers to create voids in each of the control gate layers;
via the slit, filling the voids in each of the control gate layers with metal;
filling the slit up to a level which is above a topmost control gate layer among the control gate layers for the memory cells and below the control gate layer for the select gate transistor, so that the control gate layer for the select gate transistor is accessible from the slit; and
via the slit, removing, from the control gate layer for the select gate transistor, a portion of the metal which filled the voids in each of the control gate layers.

14. The method of claim 1, wherein:
during the laser thermal annealing, the polysilicon is fully crystalized or converted to a grain size which is larger than a thickness of the control gate layer for the select gate transistor.

15. The method of claim 1, wherein:
the polysilicon comprises an open or closed cylinder.

16. A method for fabricating a memory device, comprising:
forming a stack comprising alternating control gate layers and dielectric layers, wherein the control gate layers comprise a control gate layer for a select gate transistor above control gate layers for memory cells;
etching a memory hole in the stack;
providing memory films along a wall of the memory hole adjacent to the control gate layers for the memory cells, wherein the memory films extend up to a top of the stack;
deposit a core oxide in the memory holes between the memory films, wherein the core oxide extends up to the top of the stack;
etch back the memory films and the core oxide to a level which is below the control gate layer for the select gate transistor, creating a void at a top of the memory hole;
deposit a gate oxide of the select gate transistor along a wall of the memory hole in the void;
providing silicon in the void, wherein the silicon spans the control gate layer for the select gate transistor;
performing a laser thermal annealing process on the silicon to increase a crystal fraction of the silicon; and
providing a metal in the control gate layer for the select gate transistor, wherein the silicon forms a channel of the select gate transistor, the metal provides a control gate of the select gate transistor and the gate oxide of the select gate transistor is provided between the metal and the silicon.

17. The method of claim 16, further comprising:
providing a doped polysilicon contact above the silicon, wherein the doped polysilicon contact extends from the silicon to a top of the memory hole.

18. The method of claim 16, wherein:
the providing of the gate oxide of the select gate transistor along the wall of the memory hole in the void comprises providing the gate oxide of the select gate transistor in the void and removing a bottom portion of the gate oxide, leaving the gate oxide along the wall.

19. A method for fabricating a memory device, comprising:
forming a stack comprising alternating control gate layers and dielectric layers, wherein the control gate layers comprise a control gate layer for a select gate transistor above control gate layers for memory cells;
etching a memory hole in the stack;
providing memory films along a wall of the memory hole adjacent to the control gate layers for the memory cells, wherein the memory films extend up to a top of the stack and comprise a charge-trapping material, a tunnel oxide and a polysilicon channel;
performing a laser thermal annealing process on a portion of the polysilicon channel to convert the polysilicon channel to crystalline silicon, wherein the portion of the polysilicon channel spans the control gate layer for the select gate transistor;
forming a void in the control gate layer for the select gate transistor;
via the void, removing portions of the charge-trapping material and the tunnel oxide adjacent to the control gate layer for the select gate transistor to expose a portion of the crystalline silicon;
via the void, performing epitaxial growth of the portion of the crystalline silicon to provide an epitaxial portion of the crystalline silicon;
performing thermal oxidation of the epitaxial portion of the crystalline silicon, to provide a gate oxide of the select gate transistor; and
via the void, providing a metal in the control gate layer for the select gate transistor, wherein the crystalline silicon forms a channel of the select gate transistor, the metal provides a control gate of the select gate transistor and the gate oxide of the select gate transistor is provided between the metal and the crystalline silicon.

20. The method of claim 19, further comprising:
providing a doped polysilicon contact adjacent to the crystalline silicon, wherein the doped polysilicon contact extends to a top of the memory hole.

* * * * *